United States Patent
Lee et al.

(10) Patent No.: US 10,356,917 B2
(45) Date of Patent: Jul. 16, 2019

(54) DISPLAY DEVICE

(71) Applicant: LG ELECTRONICS INC., Seoul (KR)

(72) Inventors: Hayun Lee, Seoul (KR); Cheolsoo Kim, Seoul (KR); Bumgi Min, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/489,464

(22) Filed: Apr. 17, 2017

(65) Prior Publication Data

US 2017/0359909 A1    Dec. 14, 2017

(30) Foreign Application Priority Data

Jun. 10, 2016  (KR) .................. 10-2016-0072259

(51) Int. Cl.
| | | |
|---|---|---|
| *G09F 9/33* | (2006.01) | |
| *H05K 5/02* | (2006.01) | |
| *H05K 5/00* | (2006.01) | |
| *G02F 1/1333* | (2006.01) | |
| *H01L 51/52* | (2006.01) | |

(52) U.S. Cl.
CPC ............ *H05K 5/0017* (2013.01); *G09F 9/33* (2013.01); *H05K 5/0217* (2013.01); *G02F 1/133308* (2013.01); *G02F 2001/133314* (2013.01); *H01L 51/5237* (2013.01)

(58) Field of Classification Search
CPC .... G06F 1/1656; G06F 1/1601; G06F 1/1633; F16B 43/00; F16M 13/02; G02F 1/133308; G02F 2001/133314; H05K 7/142; H05K 5/0017; H05K 5/0217; G09F 9/33; H01L 51/5237
See application file for complete search history.

(56) References Cited

U.S. PATENT DOCUMENTS 5,550,712 A  *  8/1996  Crockett ................ H05K 7/142
                                                    174/564
5,687,939 A     11/1997  Moscovitch
(Continued)

FOREIGN PATENT DOCUMENTS

CN          104345492          2/2015

OTHER PUBLICATIONS

European Patent Office Application Serial No. 17000984.9, Search Report dated Oct. 16, 2017, 11 pages.
(Continued)

*Primary Examiner* — Abhishek M Rathod
(74) *Attorney, Agent, or Firm* — Lee, Hong, Degerman, Kang & Waimey PC

(57) ABSTRACT

Provided is a display device. A display device according to the present invention comprises a display panel; a module cover disposed on the rear surface of the display panel and having at least one or more fastening holes; and a cushion covering the vicinity of the fastening hole disposed on the front surface of the module cover, wherein the vicinity of the fastening hole includes a plurality of layers and the cushion is disposed on top of the plurality of layers. According to the present invention, a module cover cannot be easily bent as a cushion is disposed in the vicinity of a fastening hole.

21 Claims, 42 Drawing Sheets

(56) References Cited

U.S. PATENT DOCUMENTS

| | | | | |
|---|---|---|---|---|
| 7,706,139 B2* | 4/2010 | Kim | ................ | G06F 1/1601 |
| | | | | 361/679.21 |
| 8,644,028 B2* | 2/2014 | Qin | ................ | H05K 7/142 |
| | | | | 361/758 |
| 9,234,652 B2 | 1/2016 | Wu | | |
| 2005/0161572 A1 | 7/2005 | Rawlings et al. | | |
| 2007/0258207 A1* | 11/2007 | Su | ................ | H01L 23/4006 |
| | | | | 361/679.46 |
| 2008/0117575 A1* | 5/2008 | Kang | ................ | G06F 1/1601 |
| | | | | 361/679.01 |
| 2012/0218724 A1* | 8/2012 | Shimizu | ................ | H05K 5/02 |
| | | | | 361/749 |
| 2013/0077217 A1* | 3/2013 | Trzaskos | ................ | G09F 23/00 |
| | | | | 361/679.02 |
| 2013/0306816 A1* | 11/2013 | Yoshida | ................ | F16M 13/02 |
| | | | | 248/224.51 |
| 2014/0281559 A1 | 9/2014 | Trachtenberg et al. | | |
| 2015/0085471 A1* | 3/2015 | Jeon | ................ | G02F 1/133608 |
| | | | | 362/97.2 |
| 2016/0118370 A1* | 4/2016 | Wu | ................ | H01L 25/167 |
| | | | | 362/19 |
| 2016/0309599 A1* | 10/2016 | Kikuchi | ................ | G09F 9/33 |

OTHER PUBLICATIONS

State Intellectual Property Office of the People's Republic of China Application Serial No. 201710431306.6, Office Action dated Jul. 3, 2018, 19 pages.

* cited by examiner (a) Prior Art (b)

(a)

(b)

(a)

(b)

(a)

(b)

(a)

(b)

DISPLAY DEVICE

Pursuant to 35 U.S.C. § 119(a), this application claims the benefit of earlier filing date and right of priority to Korean Patent Application No. 10-2016-0072259, filed on Jun. 10, 2016, the contents of which are all hereby incorporated by reference herein in its entirety.

BACKGROUND OF THE INVENTION

Field of the Invention

The present invention relates to a display device and more particularly, a display device which has a cushion in the vicinity of a fastening hole to prevent a module cover from being easily bent.

Related Art

Demand for display devices is growing in various forms as the information society is advanced, and in response to the demand, various display devices such as LCD (Liquid Crystal Display Device), PDP (Plasma Display Panel), ELD (Electro Luminescent Display), VFD (Vacuum Fluorescent Display) have been developed and are in wide use.

Among the display devices, display devices utilizing OLED (Organic Light Emitting Diode) exhibit excellent brightness and viewing angle characteristics compared with LCDs and moreover, can be implemented as ultra-slim devices since backlight units are not required.

SUMMARY OF THE INVENTION

An object of the present invention is to solve the aforementioned technical problem and others. Another object of the present invention is to provide a display device, a module cover of which is not easily bent.

To achieve a yet another object of the present invention, a display device according to one aspect of the present invention comprises a display panel; a module cover disposed on the rear surface of the display panel and having at least one or more fastening holes; and a cushion covering the vicinity of the fastening hole disposed on the front surface of the module cover, where the vicinity of the fastening hole includes a plurality of layers and the cushion is disposed on top of the plurality of layers.

The module cover can include a first and a second area disposed in the central part of the rear surface and separated from each other; and an opening can be formed in at least one of the first and the second area.

The module cover can be connected to at least one of the first and the second area and can further include a cable forming part protruding to the front of the module cover.

The display device can belong to either a first mode in which a long side is disposed in the lower part of the display device or a second mode in which a short side is disposed in the lower part of the display device, where, in the first mode, the opening is formed in the first area while in the second mode, the opening can be formed in the second area.

The first mode can be a landscape mode, and the second mode can be a portrait mode.

The second area can be disposed in the upper part of the first area.

A boundary between the first and the second area and other parts can be formed being protruding to the rear surface of the module cover.

The fastening holes can be disposed in the areas adjacent to the four corners of the module cover.

The vicinity area of the module cover can protrude more to the rear surface of the module cover than other parts.

The plurality of layers can include a first block covering the fastening hole and a second block disposed being separated further from the fastening hole than the first block, where the second block can be thicker than the first block.

The cushion can be disposed on the second block, being separated further from the fastening hole than the second block.

The cushion can be disposed on the second block, being at the same distance from the fastening hole as the second block.

The second block can include a depressed part, on which the cushion can be disposed.

The display device can further include a source PCB disposed on the rear surface of the display panel; a source COF connecting the source PCB and the display panel; and an adhesive sheet disposed between the display panel and the module cover, wherein the adhesive sheet can be disposed anywhere except on the area facing the source COF.

The fastening hole can be connected to an insertion part, a first extension part connected to the insertion part, and a second extension part being connected to the insertion part and extending in the opposite direction of the first extension part.

To achieve the yet or a still another object of the present invention, a display device according to one aspect of the present invention comprises a head part and a wall bracket for attaching the head part to a target surface, wherein the head part includes a display panel; a module cover being disposed on the rear surface of the display panel and having at least one or more fastening holes; and a cushion covering the vicinity of the fastening hole disposed on the front surface of the module cover; wherein the wall bracket includes a hook protruding to the head part and being disposed at a part facing the fastening hole; the vicinity of the fastening hole includes a plurality of layers; and the cushion is disposed on the plurality of layers.

The wall bracket can further comprise a hemming part in the edge, one part of which is bent to the target surface.

The wall bracket can further comprise a cable area in the center of one part of the wall bracket, the cable area protruding along the longitudinal direction, and the hemming part can be separated with respect to the cable area.

The display device can further comprise a guide sheet disposed at both corners of the upper part of the wall bracket, and the guide sheet, being separated from the wall bracket, can include a panel guide formed in the area in which the vertex of the head part is disposed.

The plurality of layers can include a first block covering the fastening hole and a second block disposed being separated further from the fastening hole than the first block, wherein the hook can be separated at the boundary between the first and the second block.

According to at least one of embodiments of the present invention, a module cover cannot be easily bent as a cushion is disposed in the vicinity of a fastening hole.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF EXEMPLARY EMBODIMENTS

Figure 1:
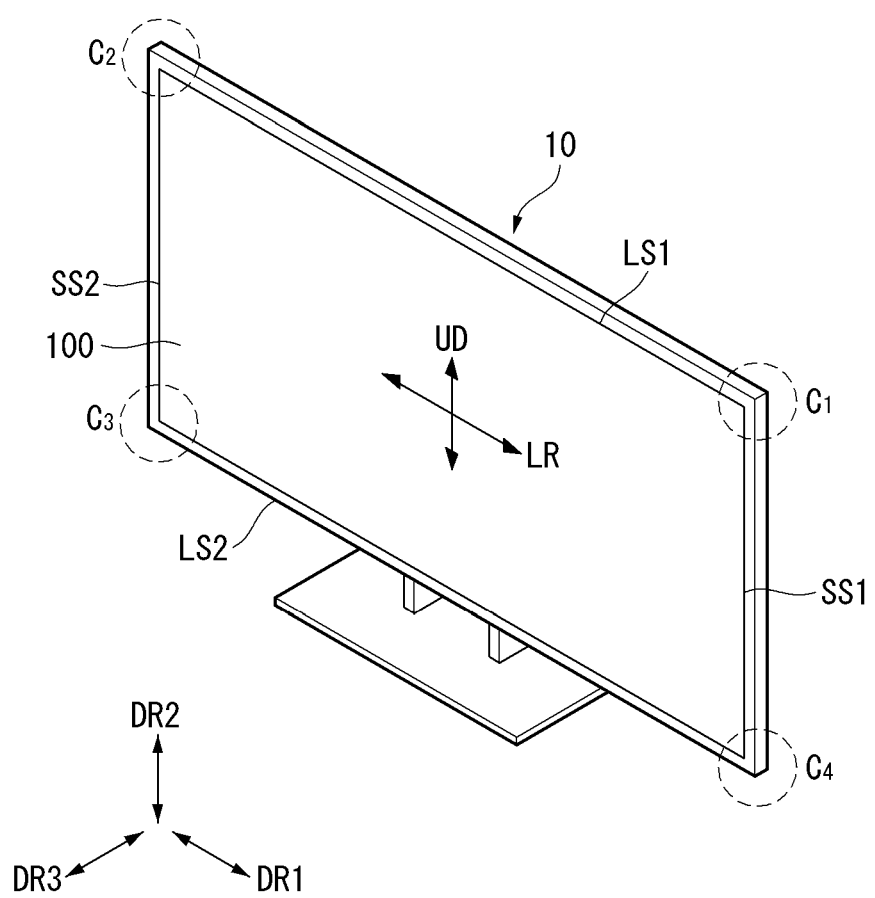
FIGS. 1 to 8 illustrate a structure of a display device according to the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

In what follows, it is assumed that a display panel is made of OLED (Organic Light Emitting Diode). However, a display panel according to the present invention is not limited to the OLED but also can be implemented by using LCD (Liquid Crystal Device), PDP (Plasma Display Panel), or FED (Field Emission Display).

FIGS. 1 to 8 illustrate a structure of a display device according to the present invention.

As shown in FIG. 1, a display panel 100 can include a first long side (LS1), second long side (LS2) opposite to the first long side (LS1), first short side (SS1) adjoining the first long side LS1 and the second long side LS2, and second short side (SS2) opposite to the first short side (SS1).

At this time, the first short side (SS1) can be called a first side area; the second short side (SS2) can be called a second side area opposing the first side area; the first long side (LS1) can be called a third side area adjoining the first side area and the second side area and being disposed between the first side area and the second side area; and the second long side (LS2) can be called a fourth side area adjoining the first side area and the second side area, being disposed between the first side area and the second side area, and opposing the third side area.

Also, for the convenience of description, it is assumed that the lengths of the first (LS1) and the second long side (LS2) are longer than those of the first (SS1) and the second short side (SS2), but it is equally applicable that the lengths of the first (LS1) and the second long side (LS2) are approximately the same as those of the first (SS1) and the second short side (SS2).

Moreover, in what follows, it is assumed that a first direction (DR1) can be parallel to the long sides (LS1, LS2) of the display panel 100, and the second direction (DR2) can be parallel to the short sides (SS1, SS2) of the display panel 100.

A third direction (DR3) can be orthogonal to the first direction (DR1) and/or the second direction (DR2).

The first direction (DR1) and the second direction (DR2) can be called collectively a horizontal direction. Also, the third direction (DR3) can be called a vertical direction.

From a different viewpoint, an area in which the head part 10 of a display device displays an image can be called a front surface. A rear surface can refer to the area that does not show an image when the head part 10 of the display device displays the image. When the head part 10 of the display device is viewed from the front surface, the side including the first long side (LS1) can be called an upper side or upper surface. In the same manner, the side including the second long side (LS2) can be called a lower side or lower surface. Also, the side including the first short side (SS1) can be called a left side or left surface, and the side including the second short side (SS2) can be called a right side or right surface.

Also, the first long side (LS1), the second long side (LS2), the first short side (SS1), and the second short side (SS2) can be called edges of the head part 10 of the display device. Also, the point at which the first long side (LS1), the second long side (LS2), the first short side (SS1), and the second short side (SS2) meet can be called a corner. For example, the point at which the first long side (LS1) and the first short side (SS1) meet can be called a first corner (C1), the point at which the first long side (LS1) and the second short side (SS2) meet can be called a second corner (C2), a point at which the second short side (SS2) and the second long side (LS2) meet can be called a third corner (C3), and the point at which the second long side (LS2) and the first short side (SS1) meet can be called a fourth corner (C4).

At this time, a direction starting from the first short side (SS1) to the second short side (SS1) or vice versa can be called a left-right (LR) direction. A direction starting from the first long side (LS1) to the second long side (LS2) or vice versa can be called a up-down (UD) direction.

Figure 2:
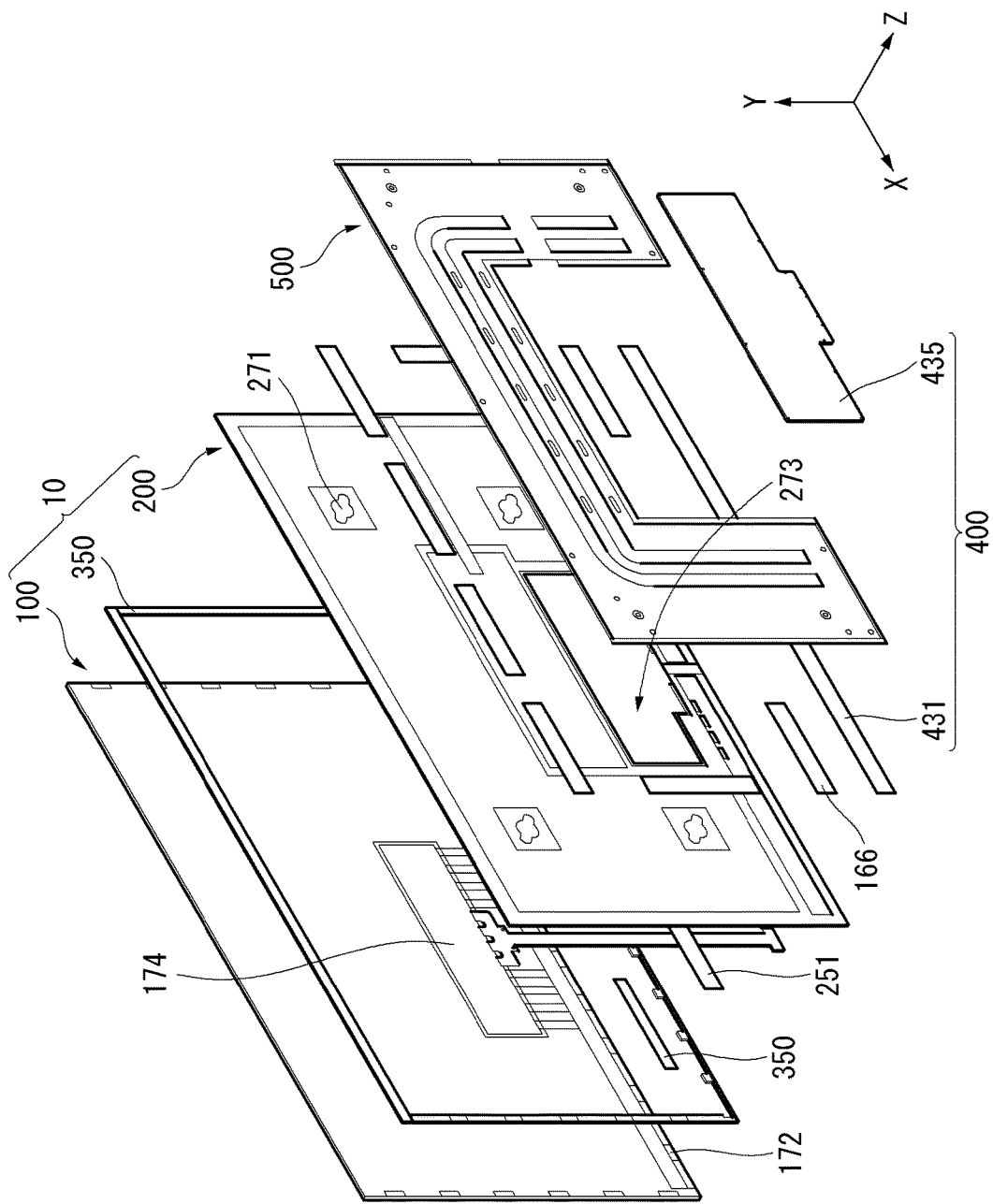

With reference to FIG. 2, the head part 10 of a display device according to the present invention can include a display panel 100, a module cover 200, and a PCB cover 400.

The display panel 100 can be provided in the front surface of the head part 10 and can display an image. The display panel 100 can divide an image into a plurality of pixels and display the image by controlling individual pixels to emit light according to their information about specified color, brightness, and saturation.

The display panel 100 can be of a rectangular shape. However, the present invention is not limited to this geometric shape, but the display panel 100 can be formed so that each edge thereof can be shaped to have a predetermined curvature. The display panel 100 can be an OLED panel. However, the present invention is not limited to the aforementioned assumption, but the display panel 100 can be made of LCD panel.

In at least one part of the rear surface of the display panel 100, an interface PCB 174 and at least one source PCB 172 can be disposed. The interface PCB 174 can be disposed in the upper part of at least one source PCB 172. At least one source PCB 172 can be connected to the interface PCB 174. Each source PCB 172 can be disposed being separated from each other.

Signal lines can be disposed in the interface PCB 174, which transmit digital video data, timing control signals, and so on delivered from a timing controller board inside a housing.

At least one source PCB 172 can apply voltage to the display panel 100 according to a signal delivered from the interface PCB 174. In other words, at least one source PCB 172 can apply a driving wave to the display panel 100 according to an image signal. The source PCB 172 can be connected to the display panel 100 by a source COF (Chip On Film) 123. The source COF 123 connected to one part of the source PCB 172 can be extended to the lower surface of the display panel 100 to be connected to the display panel 100.

The source COF 123 can be connected electrically to the source PCB 172 and data pads of the display panel 100. A data integrated circuit can be installed in the source COF 123.

An adhesive sheet 350 can be disposed on the rear surface of the display panel 100 to combine the display panel 100 and the module cover 200. The adhesive sheet 350 can be of a rectangular frame shape with an empty central area. Since the central area of the adhesive sheet 350 is empty, at least one PCB can be disposed in the empty area.

One surface of the adhesive sheet 350 can be combined with the display panel 100, and the other surface can be combined with a module cover. A detailed description about the shape of the adhesive sheet 350 will be given later.

An insulation sheet 251 can be disposed at the part opposing the source PCB 172. The insulation sheet 251 can be attached to the front surface of the module cover 200. The insulation sheet 251 can include an insulating material so that the source PCB 172 is not influenced by interference from other electronic devices. For example, the PCB cover 400 can include plastic material. Accordingly, the PCB cover 400 can protect the source PCB 172 from leakage current.

The module cover 200 can be provided on the rear surface of the display panel 100. The module cover 200 can be attached on the display panel 100 through the adhesive sheet 350. The module cover 200 can support the rear surface of the display panel 100. In other words, the module cover 200 can reinforce the strength of the display panel 100. Accordingly, the module cover 200 can include a light material with high strength. For example, the module cover 200 can include aluminum.

The vertical thickness of at least one part of the module cover 200 can differ from the vertical thickness of the remaining part thereof. In other words, the module cover can be formed arbitrarily to have different vertical thickness for at least one part thereof from the others. Thickness of edge area of the back cover 200 can be thicker than the vertical thickness of other parts. Since the module cover 200 may be manufactured by a press machine to have different vertical thickness, strength of the module cover 200 can be enhanced. Also, when being combined with the wall bracket 500, the module cover 200 can occlude part of the wall bracket 500 due to thickness of the edge area.

A fastening hole 271 can be disposed in the vicinity of four corners of the module cover 200. The fastening hole 271 can penetrate the module cover 200. The fastening hole 271 can help the wall bracket 500 be combined with the head part 10. The vertical thickness of the part at which the fastening hole 271 is formed can be thicker than the thickness along other directions. Accordingly, a fastening force can be made stronger as the wall bracket 500 and the head part 10 become close to each other.

The fastening part 166 can be disposed at the boundary of the edge area of the module cover 200. The fastening part 166 can be extended to the rear surface from the module cover 200. Accordingly, the vertical height of the part at which the fastening part is disposed can be the same as or similar to the vertical height of the part at which fastening hole of the module cover 200 is disposed. The position of the fastening part 166 is not predefined but can be disposed anywhere as long as thickness of the module cover 200 can be kept to be thin.

The fastening part 166 can include a magnetic material. The fastening part 166 can help the body 10 and the wall bracket 500 be combined more firmly by a magnetic force.

The back cover 200 can have an opening 273 at the part opposing the interface PCB 174 at the time of combination. In other words, the opening 273 can be disposed in the central part of the module cover 200. The opening 273 can secure a space between the display module 100 and the module cover 200 so that the interface PCB 174 can be disposed therein. In case too many openings 273 are formed in the module cover 200, a crack can be formed in the module cover 200, or strength of the module cover 273 can be weakened. Therefore, it is preferable for the module cover 200 to have as few openings 273 as possible.

A PCB cover 400 can be provided for the rear surface of the part in which a PCB is disposed. The PCB cover 400 can include a first and a second PCB cover 431, 435. The first PCB cover 431 can be disposed at the part opposing the source PCB 172, and the second PCB cover 435 can be disposed at the part opposing the interface PCB 174. In other words, the second PCB cover 435 can cover the opening 273. The PCB cover 400 can prevent the source PCB 172 and the interface PCB 174 from being exposed to the outside. Therefore, the PCB cover 400 can be made to be opaque so that the source PCB 172 and the interface PCB 174 cannot be exposed to the outside.

The PCB cover 400 can include an insulating material so that the source PCB 172 and the interface PCB 174 are not influenced by the interference caused by other electronic devices. For example, the PCB cover 400 can include a plastic material. Therefore, the PCB cover 400 can protect the source PCB 172 and the interface PCB 174 from leakage current.

The body 10 of the display device according to the present invention can support the display panel 100 by using only the module cover 200. In other words, other covers except for the module cover 200 may not be disposed in the body 10. Therefore, the user can feel that thickness of the body 10 has become very thin and can concentrate more on the display screen.

Figure 3:
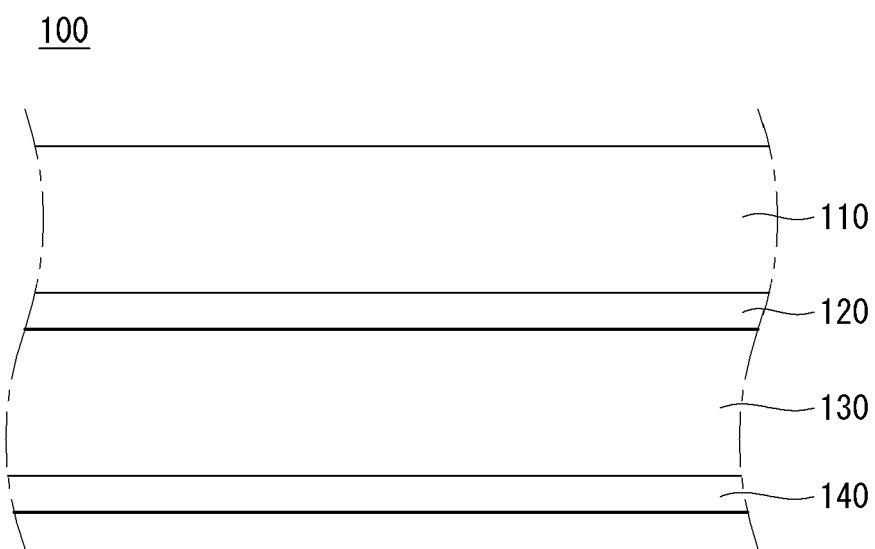

With reference to FIG. 3, the display panel 100 can include a transparent substrate 110, an upper electrode 120, an organic light emitting layer 130, and a lower electrode 140. The transparent substrate 110, upper electrode 120, organic light emitting layer 130, and lower electrode 140 can be formed sequentially.

The transparent substrate 110 and the upper electrode 120 can include a transparent material. The lower electrode 140 can include a non-transparent material. However, the present invention is not limited to the aforementioned structure, but the lower electrode 140 may include a transparent material (for example, ITO). In this case, light can be emitted through one surface of the lower electrode 140.

If voltage is applied to the upper and the lower electrode 120, 140, light emitted from the organic light emitting layer 130 can penetrate the upper electrode 120 and the transparent substrate 110 and be emitted to the outside. At this time, a light shielding plate can be formed additionally in the rear of the lower electrode so that the light emitted to the lower electrode 140 can be directed to the front surface.

The display device 100 according to the present invention can be an OLED display device. Accordingly, no separate light source is required, and thus volume and weight of the display device 100 can be reduced. Also, since response speed of an OLED display device is more than 1000 times faster than an LCD device, an afterimage cannot be observed when an image is displayed.

Figure 4:
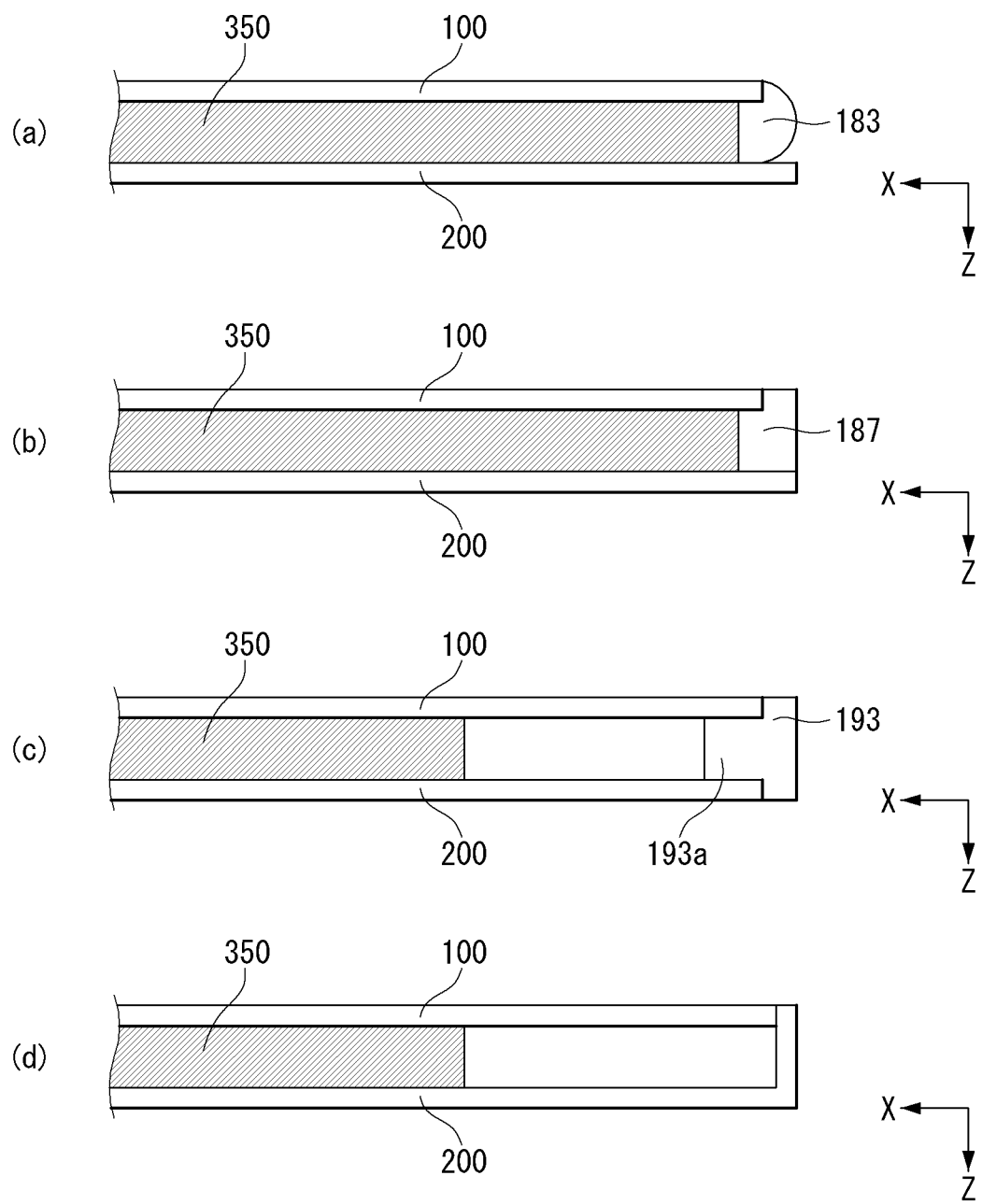

With reference to FIG. 4, a display panel 100 and a module cover 200 of a display device according to the present invention can be attached to each other through an adhesive sheet 350.

The adhesive sheet 350 can be formed to have a separate thickness. Therefore, a foreign substance or dust can get into the space between the display panel 100 and the module cover 200. To prevent this, as shown in FIG. 4(*a*), a sealing member 183 can be installed on at least one side of the adhesive sheet 350 to apply side sealing. The sealing member 183 can shield the adhesive sheet 350 and at least one side of the display panel 100 simultaneously.

In another example, as shown in FIG. 4(*b*), a frame 187 can be inserted into at least one side of the adhesive sheet 350. The frame 187 can contact at least one side of the adhesive sheet 350, and one end of the frame 187 can be bent to be extended to the display panel 100.

In a yet another example, as shown in FIG. 4(*c*), a middle cabinet 193 can be disposed between the display panel 100 and the module cover 200. The middle cabinet 193 can guide the position at which the display panel 100 is combined. The flange 193*a* of the middle cabinet 193 can be inserted between the display panel 100 and the module cover 200. The body part of the middle cabinet 193 can shield the display panel 100 and at least one side of the module cover 200 simultaneously.

The flange 193*a* of the middle cabinet 193 can be separated from the adhesive sheet 350. Therefore, since the adhesive sheet 350 doesn't have to encompass the display panel 100, the amount of adhesive sheets 350 required for manufacturing display devices can be reduced.

In a still another example, as shown in FIG. 4(*d*), edge part of the module cover 200 can be bent to the display panel 100. Since the edge part of the module cover 200 is bent, at least one side of the adhesive sheet 350 can be shielded from the outside.

In this case, it is not necessary to include another substance between the display panel 100 and the module cover 200. Therefore, manufacturing process of display devices can be simplified, and costs can be reduced. Also, edge part of the module cover 200 can be separated from the adhesive sheet 350. Therefore, since the adhesive sheet 350 doesn't have to encompass the display panel 100, the amount of adhesive sheets 350 required for manufacturing display devices can be reduced.

In the subsequent embodiments, for the convenience of description, structures formed on the side surface of the adhesive sheet 350 will not be described. Structures formed on the side surface of the adhesive sheet 350 can also be applied to other embodiments.

Figure 5:
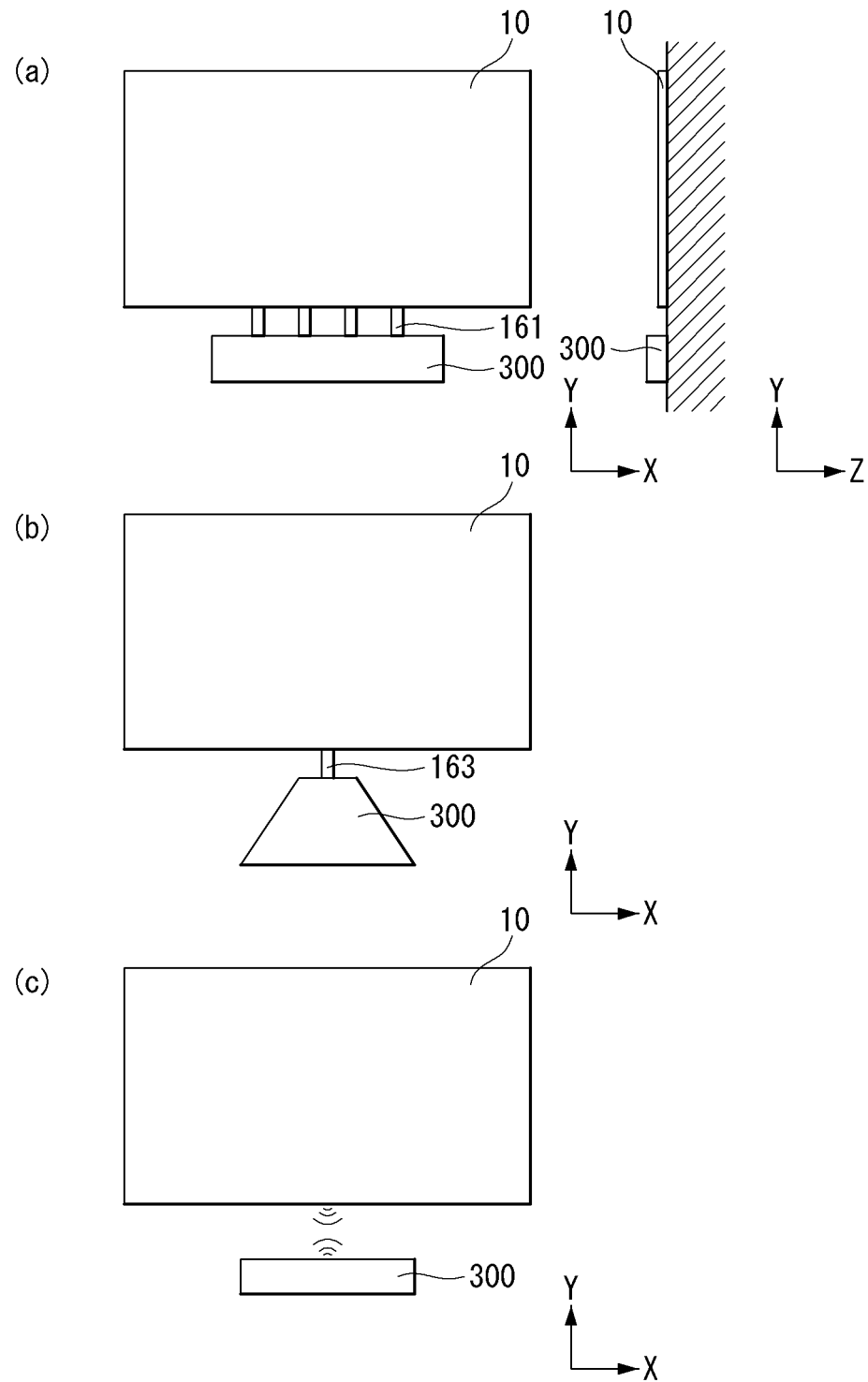
Figure 6:
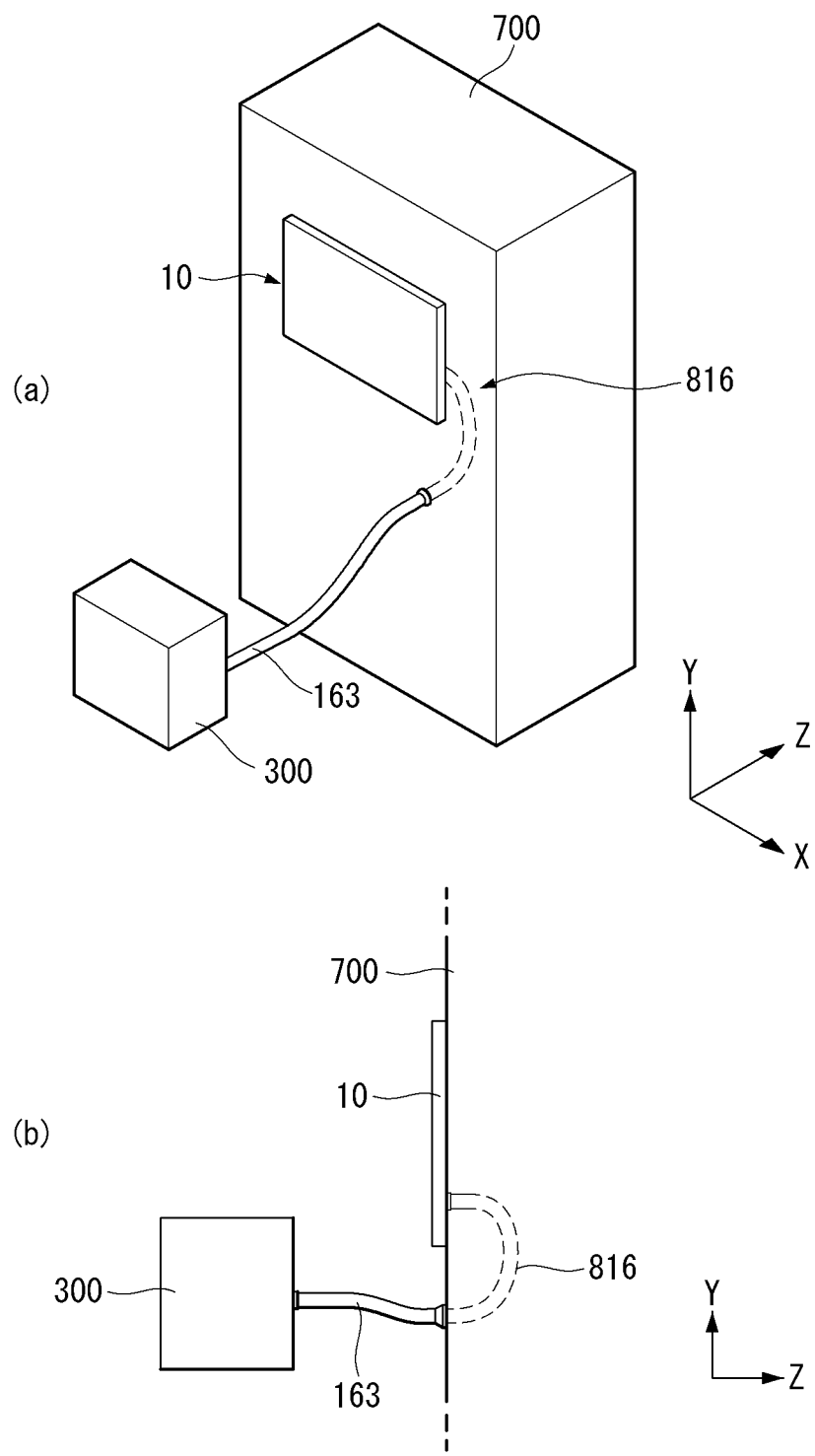

With reference to FIG. 5, a display device according to the present invention can include a housing 300 connected to the head part 10 electrically.

The housing 300 can transmit at least one signal to the head part 10. The housing 300 can shield the constituting elements driving the display device. For example, the housing 300 can shield at least one PCB. A detailed description about a fastening structure of at least one PCB and a fastening method for the at least one PCB will be given later.

The housing 300 can be separated from the head part 10. In other words, it indicates that the housing 300 may not be disposed at the part in which an image is displayed. Therefore, the user can concentrate more on the display screen.

As one example, as shown in FIG. 5(*a*), the housing 300 can be connected to the head part 10 through a plurality of flat cables 161. A flat cable 161 can include a plurality of signal connection pins and at least one or more ground pins to connect the housing 300 to the head part 10. The flat cable 161 is advantageous because it is inexpensive compared to other types of cables.

As another example, as shown in FIG. 5(*b*), the housing 300 can be combined with the head part 10 through one circular cable 163. In other words, a plurality of flat cables 161 in FIG. 5(*a*) used to connect electrical signals can be replaced with a single, circular cable 163. Since the housing 300 and the head part 10 is connected to each other through a single circular cable 163 rather than a plurality of flat cables, the user may feel that the external appearance has been much improved.

As a yet another example, as shown in FIG. 5(*c*), the housing 300 and the head part 10 can exchange an electrical signal wirelessly. In this case, the user can feel that the external appearance has been further improved than when the housing 300 and the head part 10 is connected to each other through a flat cable 161 or a circular cable 163.

The head part 10 and the housing 300 of the display device according to the present invention can be separated from each other. Therefore, the user can concentrate more on the display screen, and a display device with a thinner head part 10 can be implemented.

Figure 9:
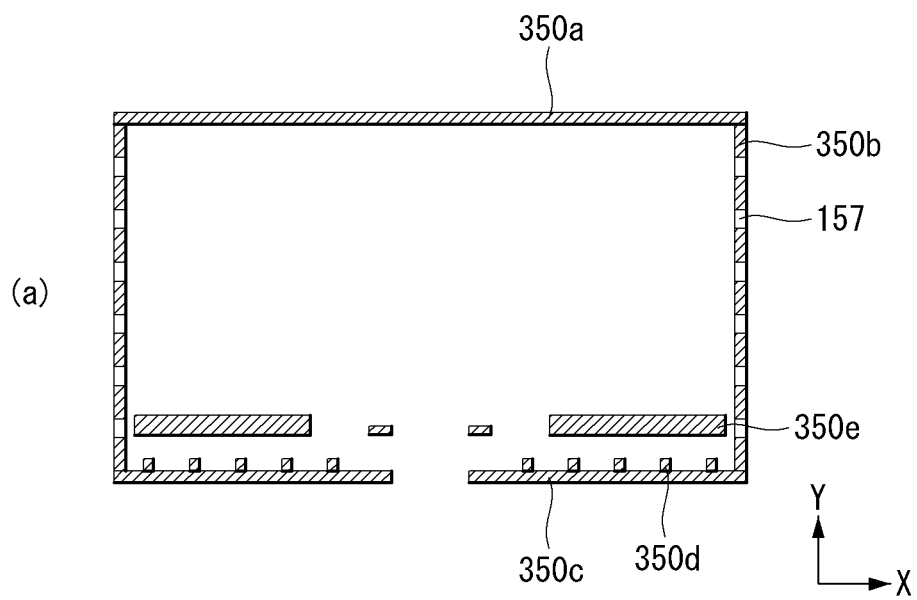
FIGS. 9 to 23 illustrate a display device according to one embodiment of the present invention.
Figure 9:
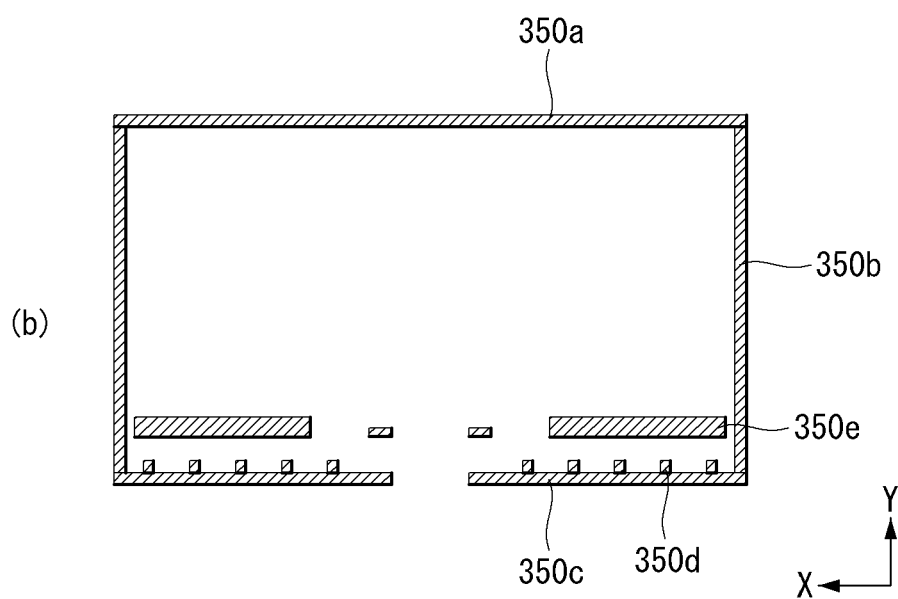

With reference to FIG. 9, a display device according to the present invention can exchange an electrical signal with the housing 300 through the electrical wiring 816 penetrating the internal part of a target surface 700 to which the head part 10 is attached. In this case, one part of the head part 10 can be connected to the electrical wiring 816.

The electrical wiring 816 can be inserted into the inside through a perforated part of the target surface 700. One part of the electrical wiring 816 can be connected to the head part 10 and the other end thereof can be connected to the circular cable 163. The electrical wiring 816 can be installed inside the target surface 700 and can be hidden from the user.

The display device according to the present invention can connect the head part 10 and the housing 300 to each other through the electrical wiring 816 inserted into the inside of the target surface 700. Accordingly, the user may have an impression that the housing 300 is not directly connected to the head part 10. Therefore, the user can feel that the external appearance has been much improved and can concentrate on the display screen.

Figure 7:
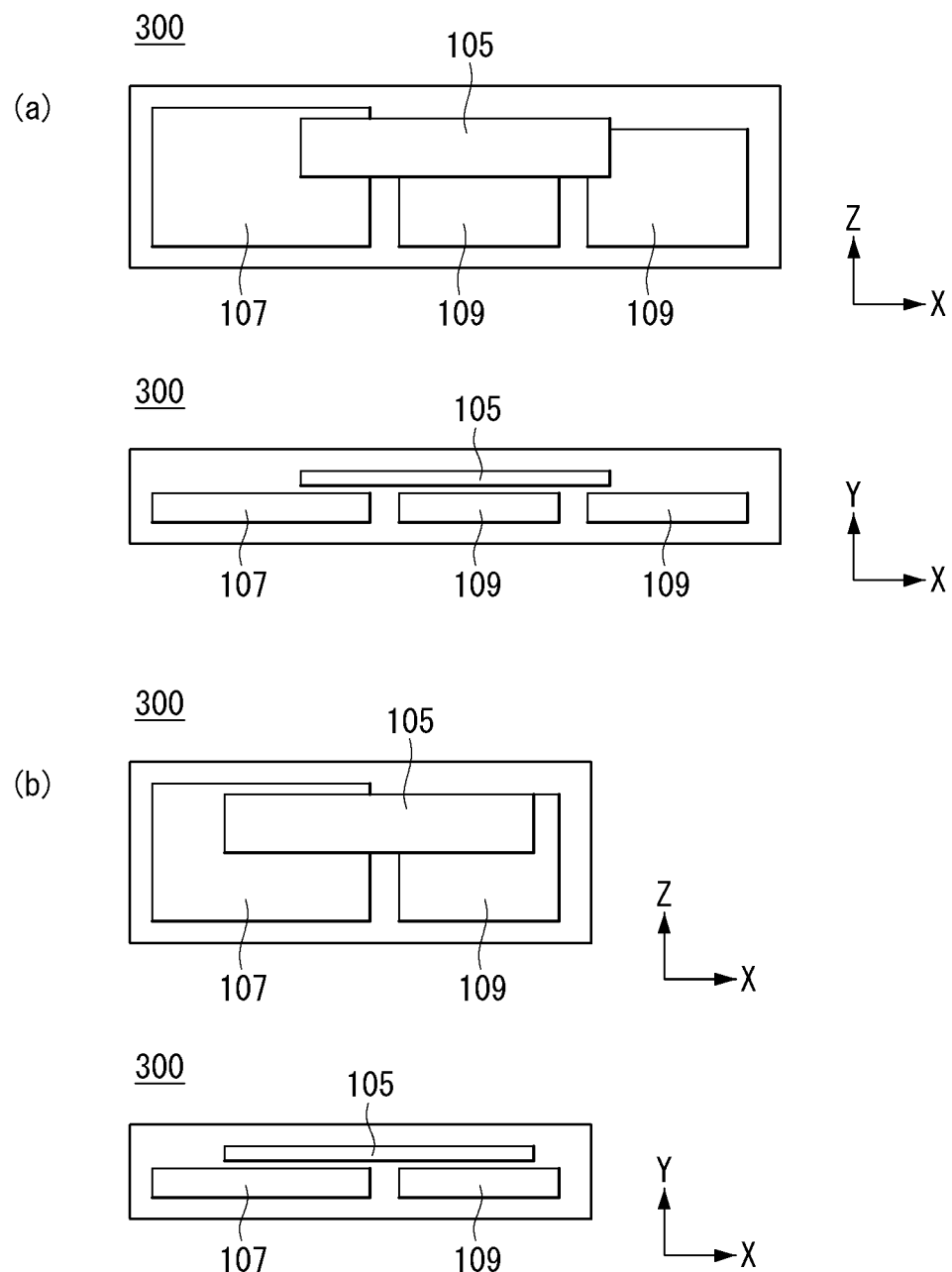

With reference to FIG. 7, at least one PCB can be disposed inside the housing 300. Individual PCBs can be separated from each other.

For example, at least one PCB can be a main board 109. The main board 109 can provide an interface through which the display device can be operated. Also, the main board 109 can check and manage operating states of the components of the display device to make them operate in an optimal condition.

As another example, at least one PCB can be a power supply 107. The power supply 107 can provide power to the display device. In other words, the power supply 107 can provide power to the head part. The power supply 107 can convert AC voltage to DC voltage. In other words, it indicates that the power supply 107 can improve electrical efficiency by changing high frequency power to low frequency power.

As a yet another example, at least one PC can be a timing controller board 105. The timing controller board 105 can deliver an input signal to the display panel. In other words, the timing controller board 105 can deliver timing signals (CLK, LOAD, SPi) for controlling the source PCB and video signals (R, G, B) to the source PCB. Also, the timing controller board 105 can control an image. The timing controller board 105 can be connected to the interface PCB through a flat cable, circular cable, or wireless transmission.

As shown in FIG. 7(a), the main board 109 can be disposed being divided into separate parts in the central part and in the right side of the housing 300, and the power supply 107 can be disposed being opposing the main board 109 in the longitudinal direction of the housing 300, for example, with respect to the central part of the housing 300.

The timing controller board 105 can be disposed in the upper surface of the main board 109 and the power supply 107. Since the timing controller board 105 is disposed in the upper surface of the main board 109 and the power supply 107, internal space of the housing 300 can be saved.

Although not shown, a T-CON (the timing controller board) shield can be attached to where the timing controller board 105 is supposed to be installed to prevent electromagnetic waves emitted out of the power supply 107 and the main board 109. In other words, it indicates that the timing controller board 105 can be combined on the T-CON shield rather than the power supply 107 and the main board 109. Accordingly, the power supply 107, the main board 109, and the timing controller board 105 can operate without interfering with one another. Also, the T-CON shield can protect the timing controller board 105 from an external impact.

The timing controller board 105 can be installed being overlapped with the power supply 107 and the main board 109 in the height direction of the housing 300. Accordingly, the timing controller board 105 can be combined more easily with the power supply 107 and the main board 109.

Differently from the configuration above, as shown in FIG. 7(b), a single main board 109 can be installed inside the housing 300. In other words, the main board 109 can be disposed in one side of the housing 300, and the power supply 107 can be disposed being opposing the main board 109 in the longitudinal direction of the housing 300.

The display device according to the present invention can save the space since the timing controller board 105 is disposed in the upper part of the power supply 107 and the main board 109. Accordingly, the overall size of the housing 300 is reduced, and the user can feel that external appearance has been improved.

Figure 8:
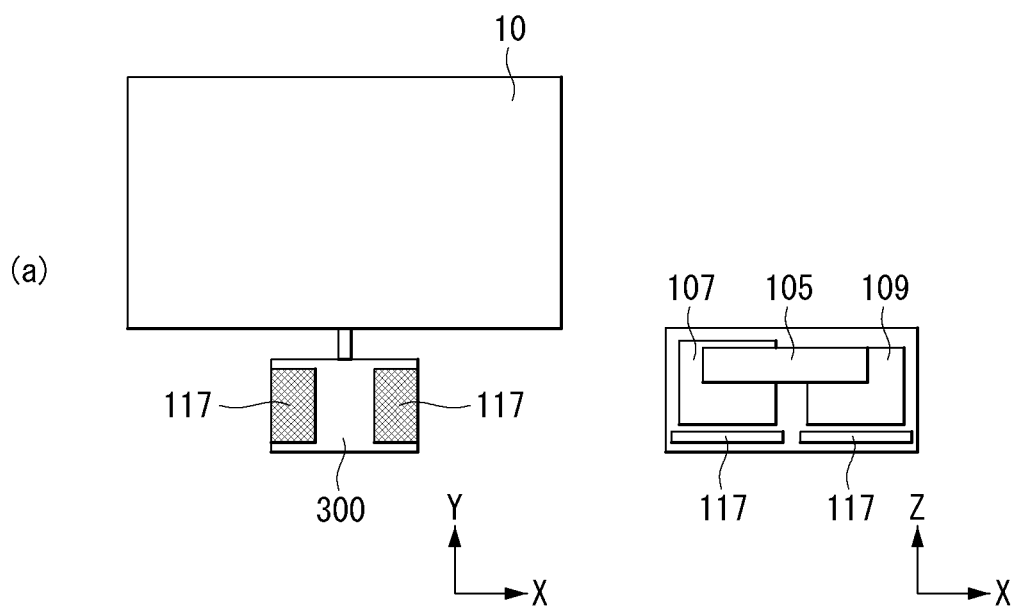
Figure 8:
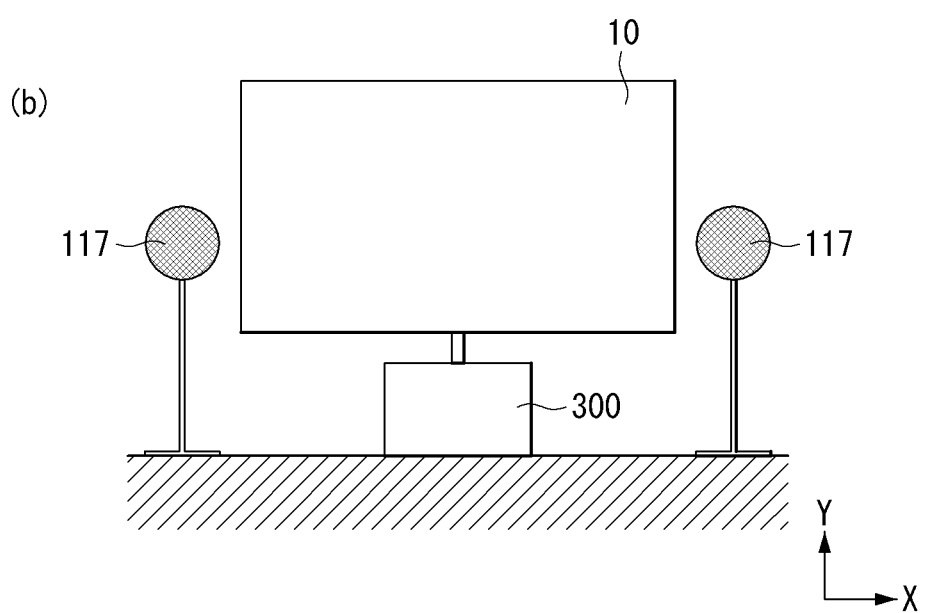

With reference to FIG. 8, speakers 117 of the display device according to the present invention can be disposed in both sides of the front of the housing 300. The speakers 117 can output sounds to the user. Accordingly, it can be more efficient to have the speakers 117 disposed on the front surface of the housing 300.

As shown in FIG. 8(a), the speakers 117 can be installed in the front surface of the housing 300, being separated from at least one PCB installed inside the housing 300. Differently from the aforementioned configuration, as shown in FIG. 8(b), the speakers 117 can be disposed being separated from each other outside the housing 300. Since the speakers 117 are disposed outside the housing 300, the user can position the speakers 117 to where sounds can be delivered faithfully to the user. The speakers 117 can be disposed at both sides of the head part 10 of the display device.

The speakers 117 of the display device according to the present invention can be disposed in the front surface or at both sides outside the housing 300. Accordingly, the user can hear the sounds from the display device more clearly.

FIGS. 9 to 23 illustrate a display device according to one embodiment of the present invention.

As shown in FIGS. 9(a) and 9(b), an adhesive sheet 350 can be disposed to enclose the edge area of the display device. In other words, the adhesive sheet 350 can combine the display panel with the edge area of the module cover.

The adhesive sheet 350 can include a first to fifth adhesive layer 350a-350e. The first adhesive layer 350a can be attached to the upper side of the display device. The first adhesive layer 350a can be extended without being segmented. Accordingly, the part in which the first adhesive layer 350a is disposed can have a large adhesive area and thus can be attached to the upper side of the display device more firmly.

The second adhesive layer 350b can be attached to both sides of the display device. The second adhesive layer 350b can adjoin both ends of the first adhesive layer 350a and the third adhesive layer 350c. The second adhesive layer 350b can be disposed on the guide panel located at both sides of the display device. The second adhesive layer 350b can be separated from the front surface of the guide panel 157 by a predetermined distance. To secure the space for an electrode connected to the display panel, at least one part of the front surface of the guide panel 157 may not allow the second adhesive layer 350b to be disposed. In other words, the second adhesive layer 350b attached to the front surface of the guide panel 157 can be disposed being separated from each other by a predetermined distance while the second adhesive layer 350b attached to the rear surface of the guide panel 157 can be extended without being segmented.

The third adhesive layer 350c can be attached to the lower side of the display device. The third adhesive layer 350c can be separated into two parts at the center thereof. Accordingly, a space in which a cable connecting the housing and the head part is disposed can be secured.

The fourth adhesive layer 350d can be disposed in the upper side of the third adhesive layer 350c. The fourth adhesive layer 350d can be 109 disposed being divided into separate parts by a predetermined distance between neighboring parts. In other words, to secure space in which a source COF connected to the display panel is disposed, the fourth adhesive layer 350d may not be disposed in at least one part of the upper side of the third adhesive layer 350c.

The fifth adhesive layer 350e can be disposed being separated from the upper side of the fourth adhesive layer 350d. The fifth adhesive layer 350e can be attached to the display panel and the module cover in the upper side of the part corresponding to the source PCB.

The adhesive sheet 350 can be disposed being enclosing the edge area of the display device according to the present invention. Accordingly, the display device can be combined more firmly than when the adhesive sheet 350 is disposed in a different manner from the description above.

Figure 10:
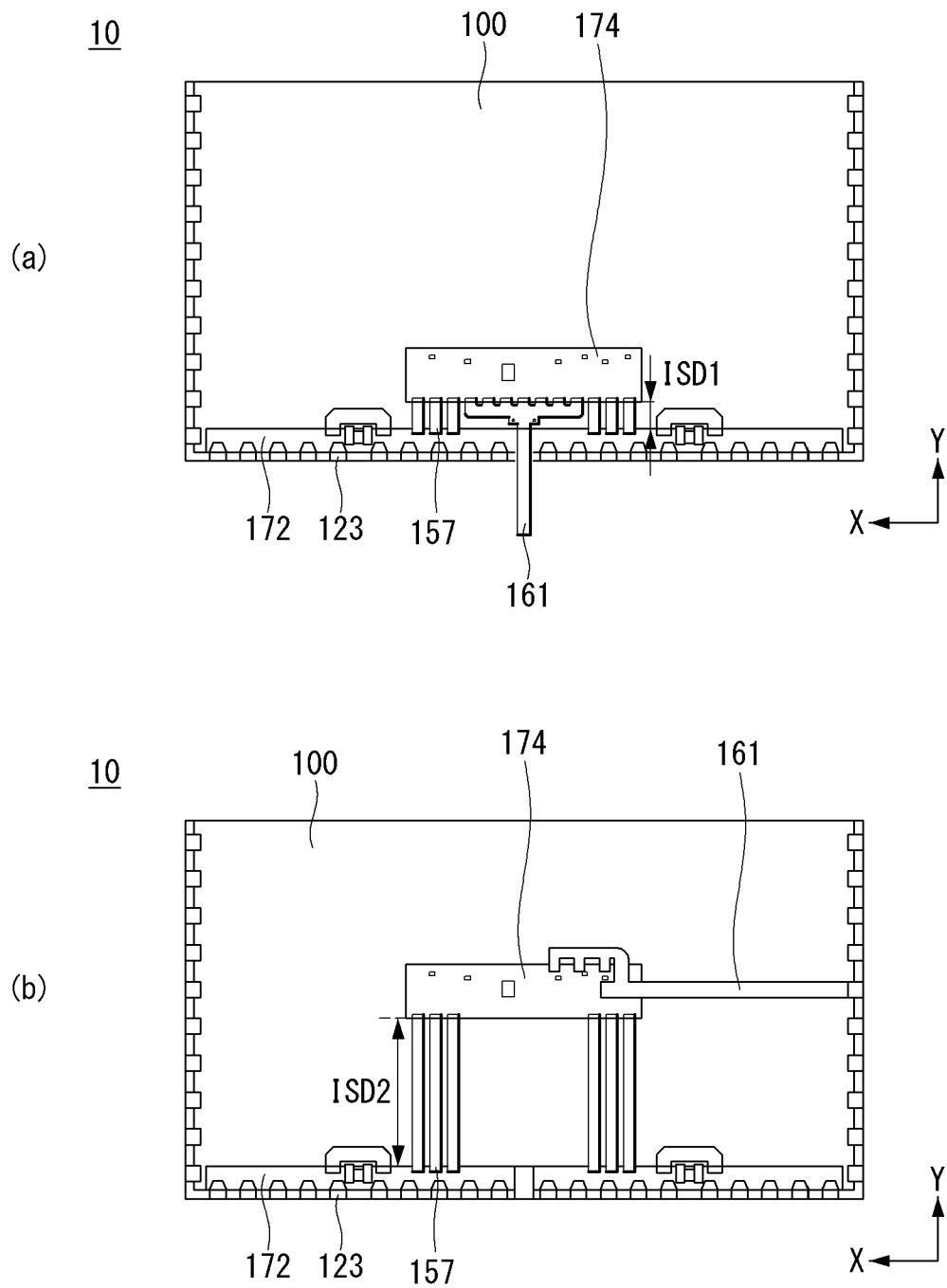

With reference to FIG. 10, the interface PCB 174 can be disposed in the upper part of the source PCB 172. The interface PCB 174 can be disposed in the rear surface of the display panel 100. The interface PCB 174 can be connected to the source PCB 172 through a connector 157. The interface PCB 174 can be disposed at the center in the longitudinal direction of the display panel 100. However, the present invention is not limited to the aforementioned configuration, but the interface PCB 174 may be disposed in one side of the display panel 100.

The interface PCB 174 can deliver an electrical signal to the housing through a flat cable 161. A flat cable 161 can include a plurality of signal connection pins and at least one or more ground pins to connect the interface PCB 174 to the housing. The flat cable 161 is advantageous because it is inexpensive compared to other types of cables.

As shown in FIG. 10(a), the interface PCB 174 can be disposed on the upper side of the source PCB 172, being separated by a first distance ISD1. Since the first distance (ISD1) is short, the interface PCB 174 can be disposed in the lower side of the display panel 100. Accordingly, the distance between the housing disposed below the display device and the interface PCB 174 can become short. In other words, length of the flat cable 161 can be shortened.

Various driving ICs can be installed on the interface PCB 174. A driving IC can transmit and receive data between the source PCB and the housing. For example, a driving IC can be SERDES (Serializer/Deserializer) IC. A SERDES IC can convert serial data/parallel data exchanged inside the chip to parallel data/serial data. Accordingly, a SERDES IC can transmit a signal quickly.

As shown in FIG. 10(b), the interface PCB 174 can be disposed on the upper side of the source PCB 172, being separated by a second distance ISD2 from the source PCB 172. The second distance ISD2 can be larger than the first distance ISD1. The interface PCB 174 can be disposed in the center of the display panel 100. Accordingly, the distance between the housing disposed on the side surface of the display device and the interface PCB 174 can become short. In other words, length of the flat cable 161 can be shortened.

The display device according to the present invention can be connected to the flat cable 161 through the interface PCB 174. Accordingly, a large amount of data can be transmitted and received more quickly by the driving IC installed on the interface PCB 174.

Figure 11:
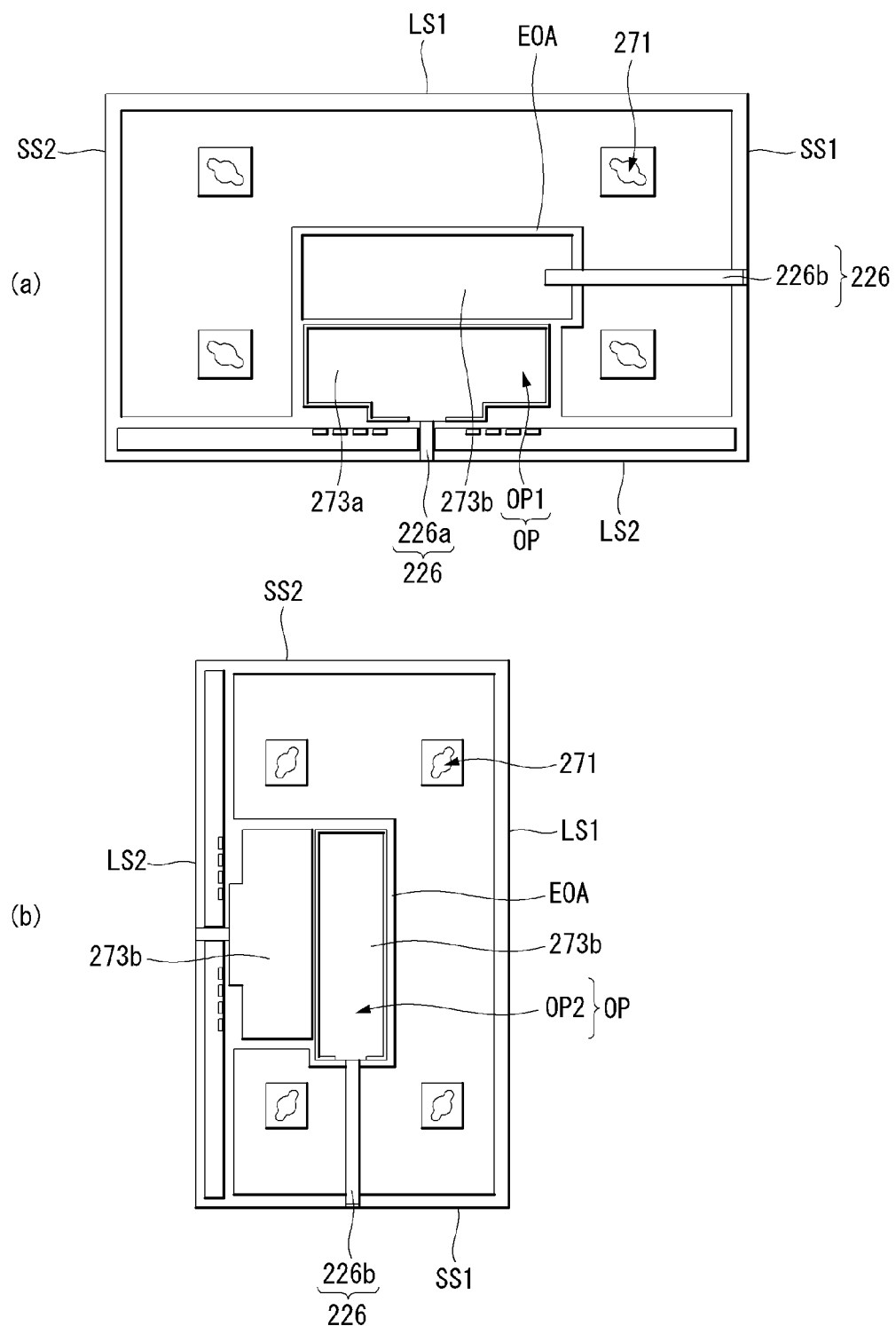

As shown in FIG. 11, a display device according to the present invention can belong to either a first mode in which a second long side (LS2) is disposed in the lower part of the display device or a second mode in which a first short side (SS1) is disposed in the lower part of the display device. The first mode can be a landscape mode, and the second mode can be a portrait mode.

In the first mode, the display device can be extended in the horizontal direction while, in the second mode, the display device can be extended in the vertical direction. Accordingly, the user can change the state of the display device according to a desired screen ratio.

A first area 273a and a second area 273b can be formed in the center of the module cover 200. The first area 273a can be disposed in the lower part of the module cover 200, and the second area 273b can be disposed in the center of the module cover 200. The second area 273b can be disposed in the upper side of the first area 273a. At least one of the first and the second area 273a, 273b can be placed at the corresponding position to the interface PCB.

The boundary (EOA) between the first and the second area 273a, 273b and other parts can protrude toward the rear surface. Accordingly, the module cover 200 can be formed arbitrarily not to be bent easily.

As shown in FIG. 11(a), when the display device is in the first mode, the interface PCB can be disposed in the lower side of the display panel. Accordingly, a first opening OP1 can be formed in the first area 273a of the module cover 200. In this case, a flat cable connected to the interface PCB can be extended toward the second long side (LS2) of the display device. Accordingly, a first cable forming part 226a can be disposed in the lower side of the first opening OP1. The first cable forming part 226a can be the part formed toward the front surface. The first cable forming part 226a can secure a space in which the flat cable can be disposed between the head part and a target surface.

Differently from the description above, as shown in FIG. 11(b), in case the display device is in the second mode, the interface PCB can be disposed in the center of the display panel. Accordingly, a second opening OP2 can be formed in the second area 273b of the module cover 200. In this case, the flat cable connected to the interface PCB can be extended toward the first short side (SS1) of the display device. Accordingly, a second cable forming part 26b can be disposed in the lower side of the second opening OP2. The second cable forming part 226b can be the part formed toward the front surface. The second cable forming part 226b can secure a space in which the flat cable can be disposed between the head part and a target surface.

The position of an opening OP of the display device according to the present invention can be changed according to the mode of the display device. Accordingly, length of the flat cable can be shortened, and thus manufacturing costs can be saved.

Figure 12:
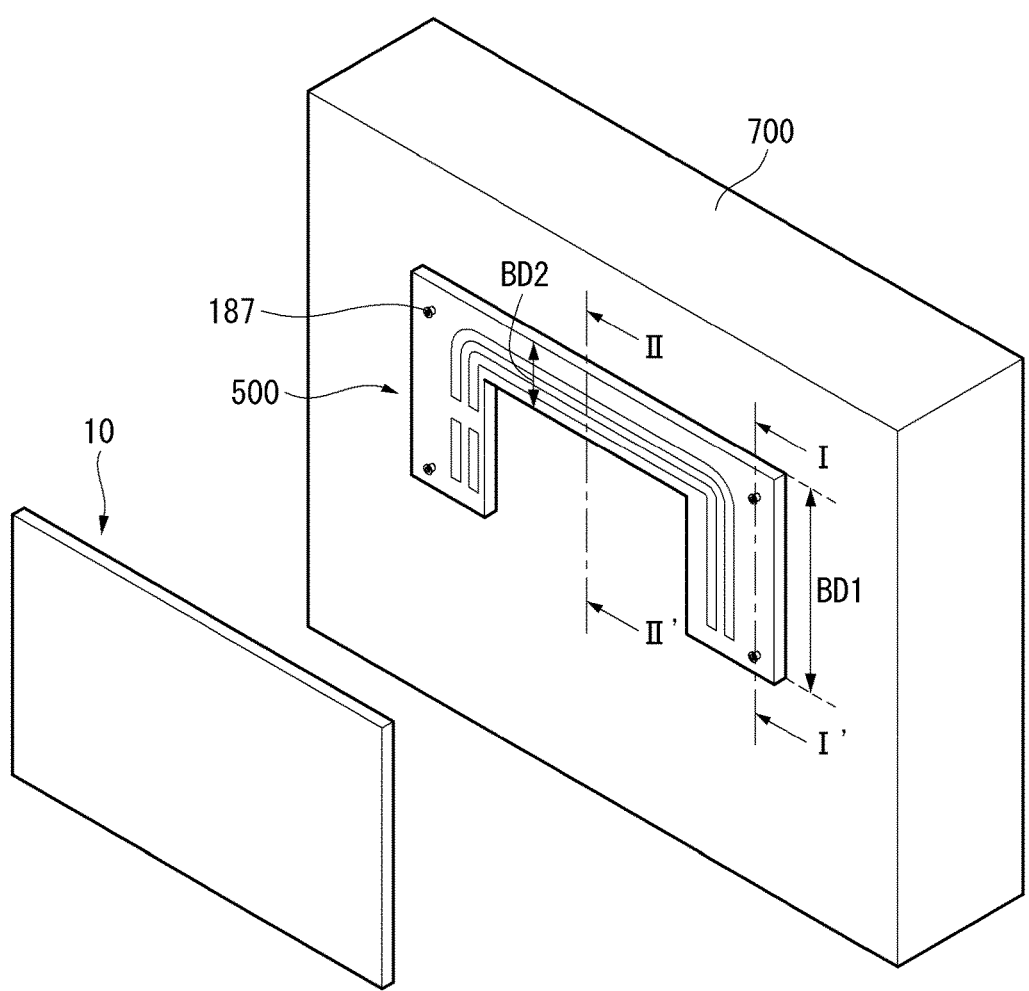

FIG. 12 illustrates a position relationship of a head part and a wall bracket of a display device according to one embodiment of the present invention.

Figure 13:
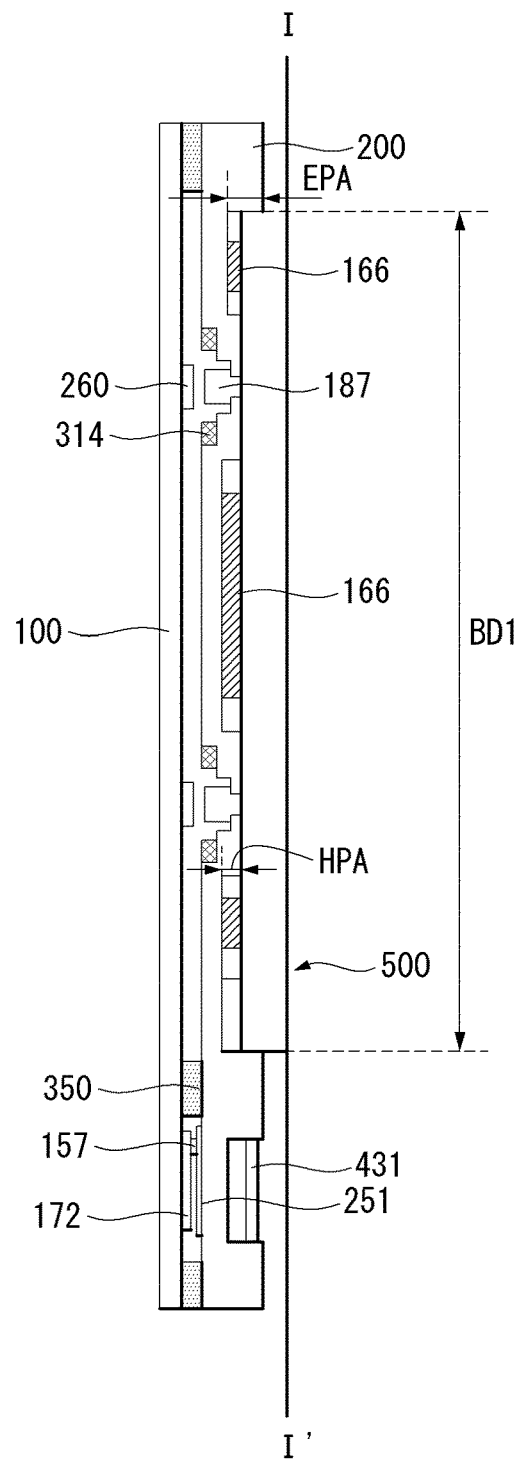
Figure 14:
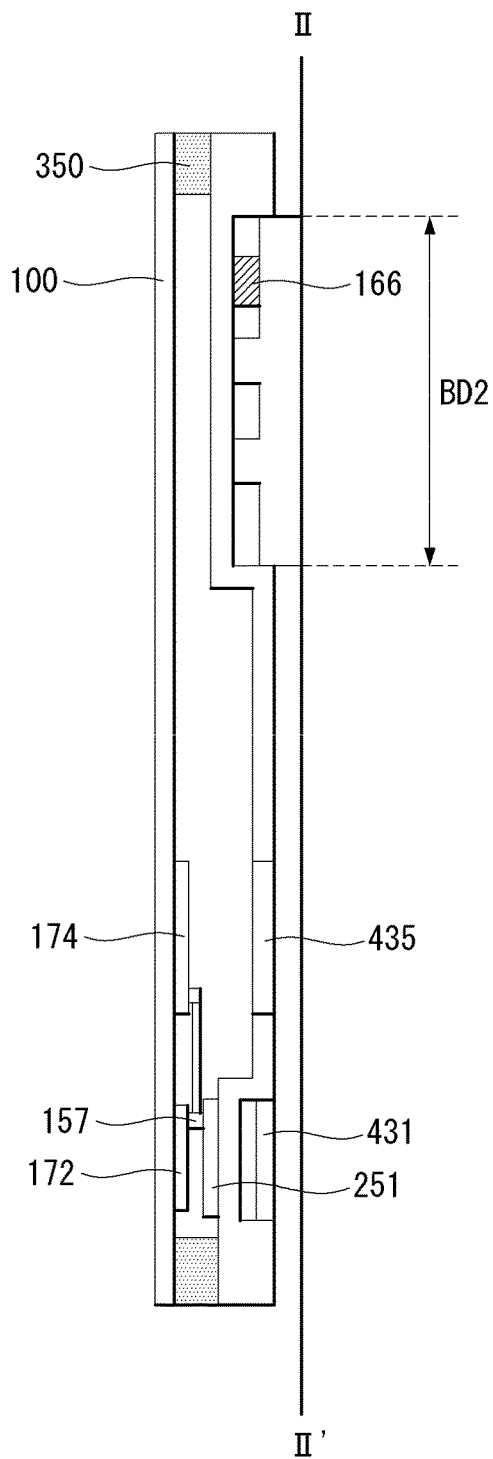

As shown in FIGS. 12 to 14, in a display device according to the present invention, a head part 10 can be attached to a target surface 700. In other words, the head part 10 can be either in a first state in which the head part 10 is combined with the target surface 700 or in a second state in which the head part 10 is separated from the target surface 700.

The head part 10 can be combined with the target surface 700 through the wall bracket 500 disposed on the target surface 700. In other words, the head part 10 is combined with the wall bracket 500 in the first state while the head part 10 is separated from the wall bracket 500 in the second state. A hook 187 can be disposed at the corresponding part of the wall bracket 500 to the fastening hole 271 of the head part 10. In other words, a hook 187 can be disposed at four corners of the wall bracket 500. In the second state, the hook 187 can be inserted into the fastening hole 271 of the module cover 200.

Thickness of each part of the module cover 200 can be different from each other. In other words, the module cover 200 can be formed arbitrarily to have different thickness for each part of the module cover. Accordingly, strength of the module cover 200 can be improved. Those parts of the module cover 200 not corresponding to the wall bracket 500 can protrude further than the parts corresponding to the wall bracket 500 by a first distance (EPA). Accordingly, in the second state, at least part of the wall bracket 500 can be occluded by the thickness of the protruding part of the module cover 500.

The vicinity of the fastening hole 271 of the module cover 200 can protrude further than other area by a second length (HPA). The second length (HPA) can be shorter than the first length (EPA). Accordingly, a space in which the fastening part 166 is disposed can be secured in other part of the module cover 200. Also, the vicinity area of the fastening hole 271 is made to be close to the wall bracket 500, and the head part 10 can be combined with the wall bracket 500 more easily.

A protecting sheet 260 can be disposed on the rear surface of the display panel 100. The protecting sheet 260 can be disposed at a part corresponding to the hook 187 in the second state. In other words, the protecting sheet 260 can be disposed being close to the four corners of the display panel 100. The protecting sheet 260 can be used to prevent a crack from being formed as the hook 187 is inserted into the fastening hole 271 and contacts the display panel 100.

The height of the wall bracket 500 in the up-down direction along the longitudinal axis can be such that the height BD1 measured between both ends can be larger than the height BD2 of the central part. It is so constructed to secure a space in which the interface PCB 174 of the head part 10 can be disposed. In other words, this can be a structural means for the wall bracket 500 not to contact the second PCB cover 435.

Also, the height DD of the head part 10 in the up-down direction can be larger than the height BC of the wall bracket 500. It is so constructed to secure a space in which the source PCB 172 of the head part 10 can be disposed. In other words, this can be a structural means for the wall bracket 500 to secure a space in which the first PCB cover 431 can be disposed. In other words, it can be a structural means for the wall bracket 500 not to contact the first PCB cover 431.

The wall bracket 500 can include a metallic material. For example, the wall bracket 500 can include aluminum material. Since the wall bracket 500 includes a metallic material, it can be combined with the fastening part 166 of the head part 10 by a magnetic force. Accordingly, the head part 10 and the wall bracket 500 can be combined together more firmly.

In the display device according to the present invention, the head part 10 can be combined with the target surface 700 as a hook 187 is inserted into the fastening hole 271, and the fastening part 166 is attached to the wall bracket 500. Accordingly, the head part 10 and the target surface 700 can be combined tightly together.

Figure 15:
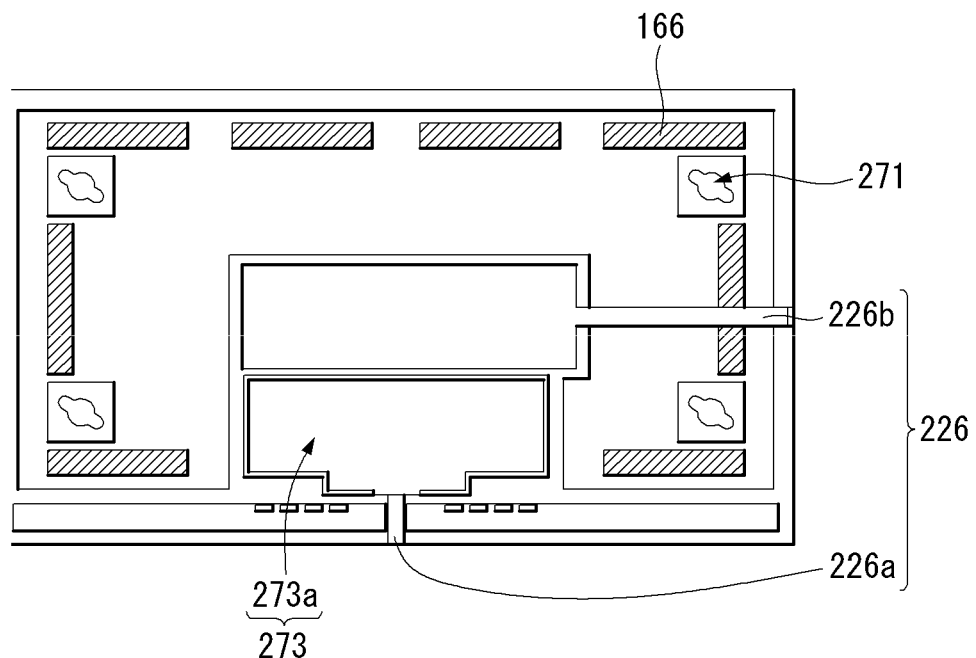
Figure 16:
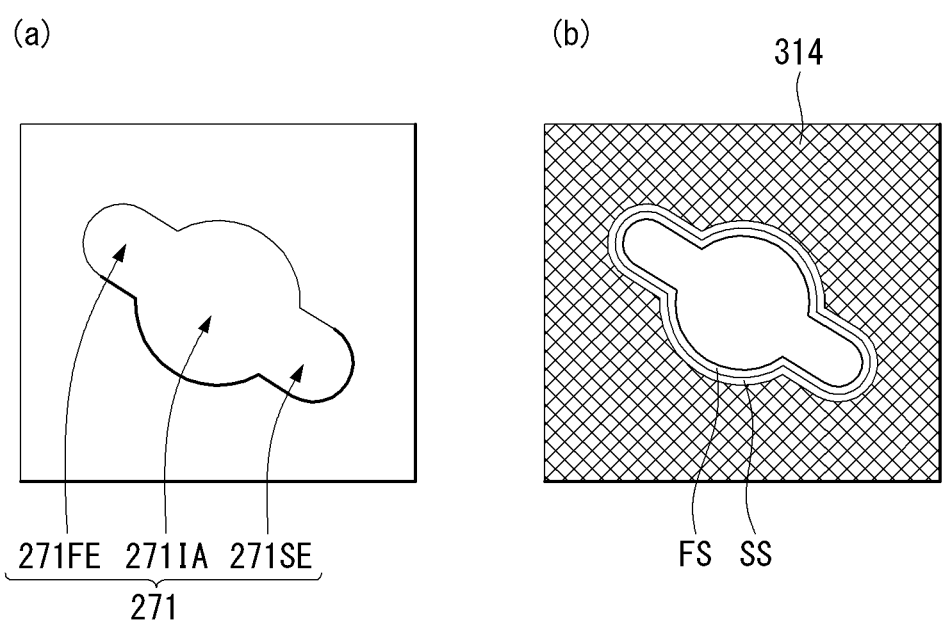
Figure 17:
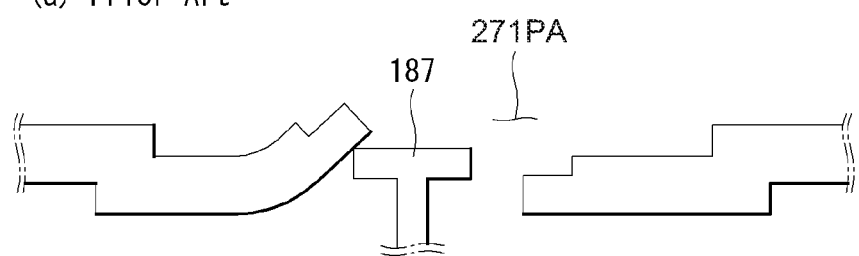
Figure 17:
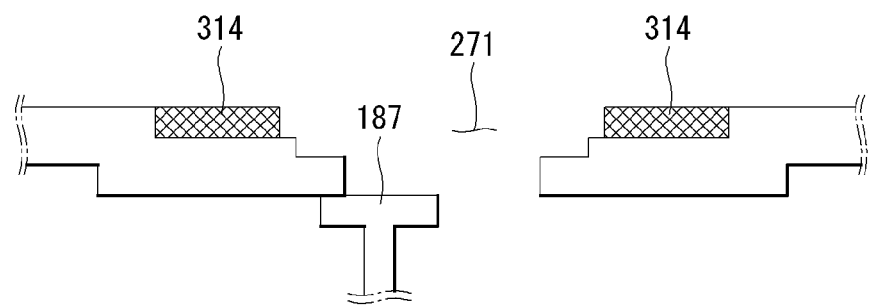
Figure 18:
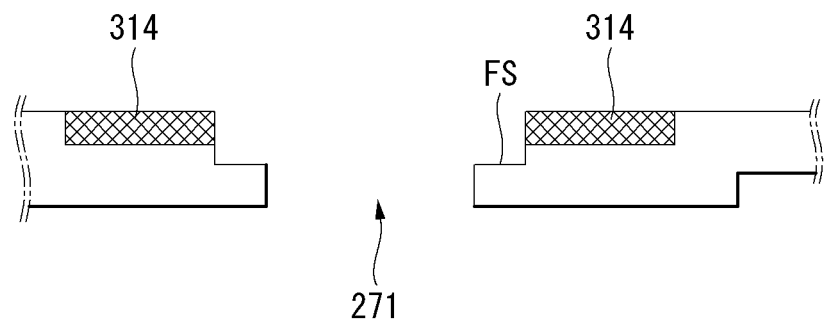
Figure 18:
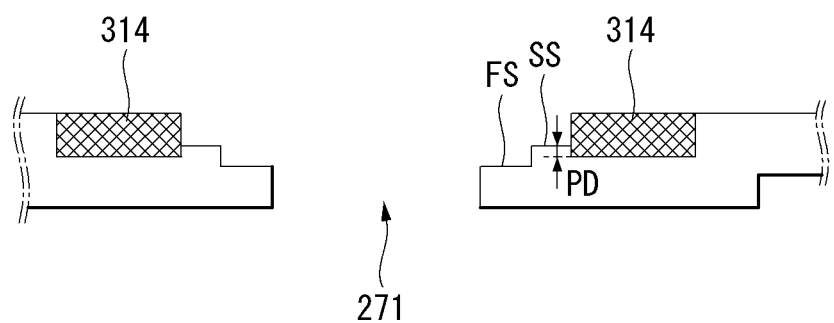

As shown in FIG. 15, the fastening part 166 can be divided into a plurality of segments. The fastening part 166 can be disposed in the vicinity of the edge area of the module cover 200. Also, the fastening part 166 may not be disposed in the cable forming part 226. Accordingly, the fastening part 166 can be separated with respect to the cable forming part 226.

Since the fastening part 166 is disposed in the form of a plurality of segments separated from each other, manufacturing of the fastening part 166 can be simplified, and substitution thereof can be done easily.

As shown in FIGS. 16(a) and (b), the fastening hole 271 can include an insertion part 271IA and a first and a second extension part 271FE, 271SE. Through the insertion part 271IA, a hook can be inserted into the fastening hole 271. Accordingly, the insertion part 271IA can be shaped as a circle with a large diameter through which a hook can be inserted. However, the present invention is not limited to the aforementioned shape, but the insertion part 271IA can be shaped as an ellipse or a polygon.

The first and the second extension part 271FE, 271SE can be extended from the insertion part 271IA in one direction. The first extension part 271FE and the second extension part 271SE can be extended in the opposite direction to each other. For example, if the first extension part 271FE is extended along a direction inclined at an angle of 45 degrees to the left from the y-axis, the second extension part 271SE can be extended along a direction included at an angle of 135 degrees to the right from the y-axis.

The first and the second extension part 271FE, 271SE can be the part at which a hook is fixed within the fastening hole 271. Accordingly, the first and the second extension part 271FE, 271SE can be shaped as a small circle so that a hook can be fixed easily. However, the present invention is not limited to the aforementioned configuration, but the first and the second extension part 271FE, 271SE can be shaped as an ellipse or a polygon.

A cushion 314 can be disposed in the vicinity of the fastening hole 271. A cushion can be used to prevent a crack from being formed in the vicinity of the fastening hole 271 or to prevent the fastening hole area from being bent.

The vicinity of the fastening hole 271 can be formed by a plurality of layers. For example, the rear surface of the vicinity of the fastening hole 271 can include a first layer FS and a second layer SS. Thickness of the first layer FS can be different from that of the second layer SS. For example, the first layer FS can be thinner than the second layer SS. The first layer FS can correspond to a boundary part of the fastening hole 271, and the second layer SS can be disposed being separated further from the fastening hole 271 than the first layer FS. Therefore, the first layer FS and the second layer SS can be shaped as a staircase with respect to the fastening hole 271.

The cushion 314 can be disposed being separated further from the fastening hole 271 than the second layer SS. In other words, the cushion 314 can function as a third layer. In this case, the first layer FS, the second layer SS, and the cushion 314 can be shaped as a staircase with respect to the fastening hole 271.

As shown in FIG. 17(a), a display device according to the prior art may not have the cushion 314 in the vicinity of the fastening hole 271PA. In this case, in case a hook 187 is not combined to the fastening hole 271PA correctly, the vicinity of the fastening hole 271PA can be bent, or a crack can be developed therein. In other words, it indicates that the cushion does not support the vicinity of the fastening hole 271PA.

Differently from the description above, as shown in FIG. 17(b), a cushion 314 can be formed in the vicinity of the fastening hole 271 of the display device according to the present invention. Accordingly, even if the hook 187 is not combined to the fastening hole 271 correctly, or even if the hook 187 contacts the vicinity of the fastening hole 271 while being removed therefrom, the cushion 314 can support the vicinity of the fastening hole 314. Since a cushion 314 is disposed in the vicinity of the fastening hole 271 of the display device according to the present invention, the vicinity of the fastening hole 271 can be prevented from being bent, or a crack can be prevented from being developed therein.

As shown in FIG. 18(a), in the display device according to the present embodiment, a cushion 314 can be disposed being separated from the first layer FS by a predetermined distance. In other words, it indicates that a cushion 314 can be disposed on the second layer, not being separated from the fastening hole 271. In this case, the cushion 314 can function as a second layer.

If the cushion 314 is disposed in the area not separated from the second layer, the cushion 314 can be disposed being closer to the fastening hole 271 than would otherwise be disposed. Therefore, the vicinity of the fastening hole 271 can be better protected from an impact.

As shown in FIG. 18(b), in the display device according to the present embodiment, a cushion 314 can be disposed below the second layer SS by a predetermined distance (PD). In other words, the cushion 314 can be placed on a depressed part within the second layer SS. In this case, thickness of the cushion 314 can be made to be thicker by the depth of the depressed part. In other words, the cushion 314 can function as a third layer.

In the display device according to the present invention, a cushion 314 can be placed on a depressed part below the second layer SS. Accordingly, a forming area of the module cover is increased to enhance the strength of the module cover 200. Also, since the cushion 314 is inserted into the depressed part, the vicinity of the fastening hole 271 can be protected more firmly from an external impact.

Figure 19:
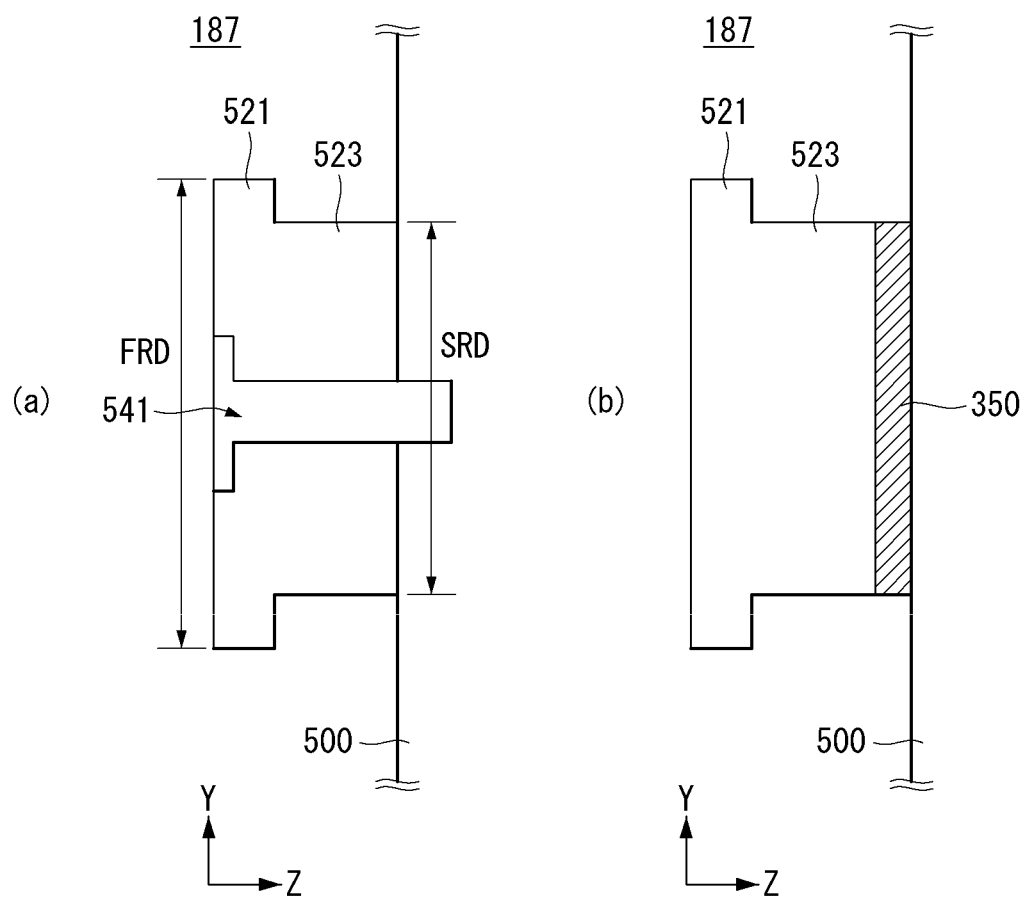
Figure 20:
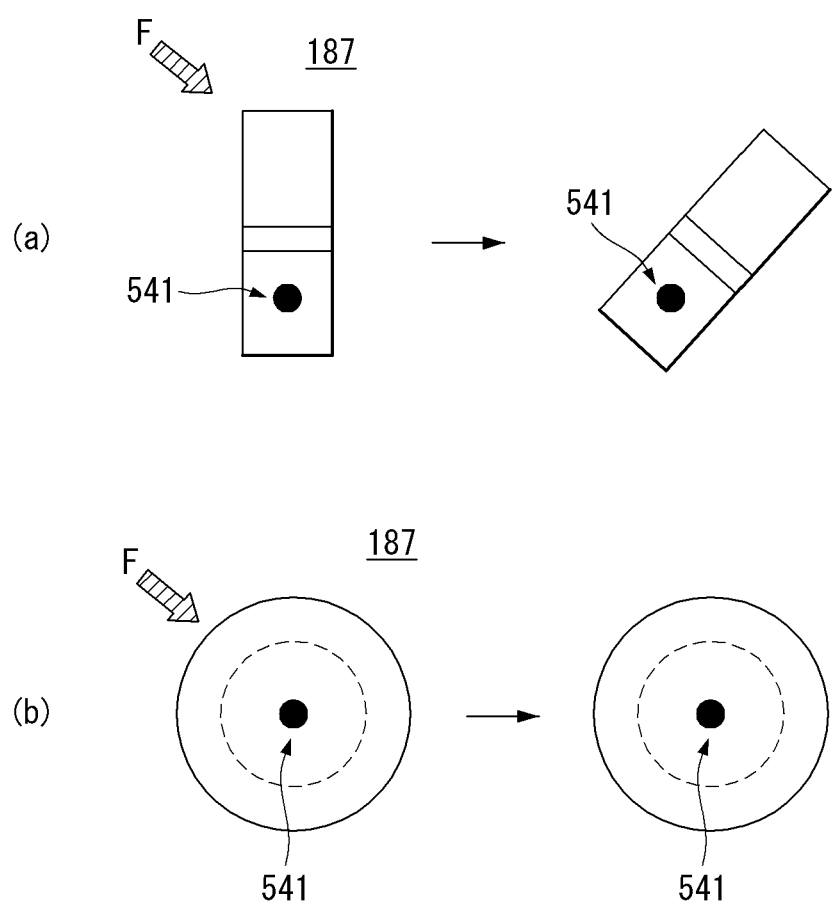

FIGS. 19 and 20 illustrate a hook according to one embodiment of the present invention.

As shown in FIG. 19, a hook 187 can include a first diameter part 521 and a second diameter part 523. A hook 187 can be shaped as a cylinder. The diameter FRD of the first diameter part 521 and the diameter SRD of the second diameter part 523 can be different from each other. For example, the diameter FRD of the first diameter part 521 can be larger than the diameter SRD of the second diameter part 523.

Since the hook 187 is formed with the first diameter part 521 and the second diameter part 523, diameters of which are different from each other, it can be hooked to the module cover more easily instead of being separated therefrom.

As shown in FIG. 19(a), the hook 187 can be combined with the wall bracket 500 through at least one hole 541 by using a screw. In this case, the hook 187 and the wall bracket 541 can be combined firmly to each other.

Differently from the description above, as shown in FIG. 19(b), the hook 187 can be combined with the wall bracket 500 through an adhesive sheet 350. Using the adhesive sheet 350 can save costs compared with other combining methods.

Though two methods for combining the wall bracket 500 and the hook 187 have been described, the present invention is not limited to the two methods, but the wall bracket 500 and the hook 187 can be combined together by using Velcro or welding.

With reference to FIG. 20, a hook 187 according to the present invention can be shaped as a cylinder having two different diameters.

As shown in FIG. 20(a), in case the hook 187 is shaped as being extended in one direction, if an external force is applied to one side of the hook 187, the hook 187 can be inclined along the direction of the external force. In this case, the combining force of the hook 187 to the body can be weakened, and in an extreme case, the hook 187 may not be combined with the head part.

Differently from the description above, as shown in FIG. 20(b), in case the hook 187 is shaped as a cylinder, even if an external force is applied to one side of the hook 187, there can be no change since the shape of the hook 187 is the same from every direction. Accordingly, the combining force of the hook 187 can be kept to be the same against other external forces.

The hook 187 of the display device according to the present invention can be shaped as a cylinder. Accordingly, the hook 187 is not influenced by an external force; thus, a combining force between the head part and the hook 187 can be maintained even after a long time period.

Figure 21:
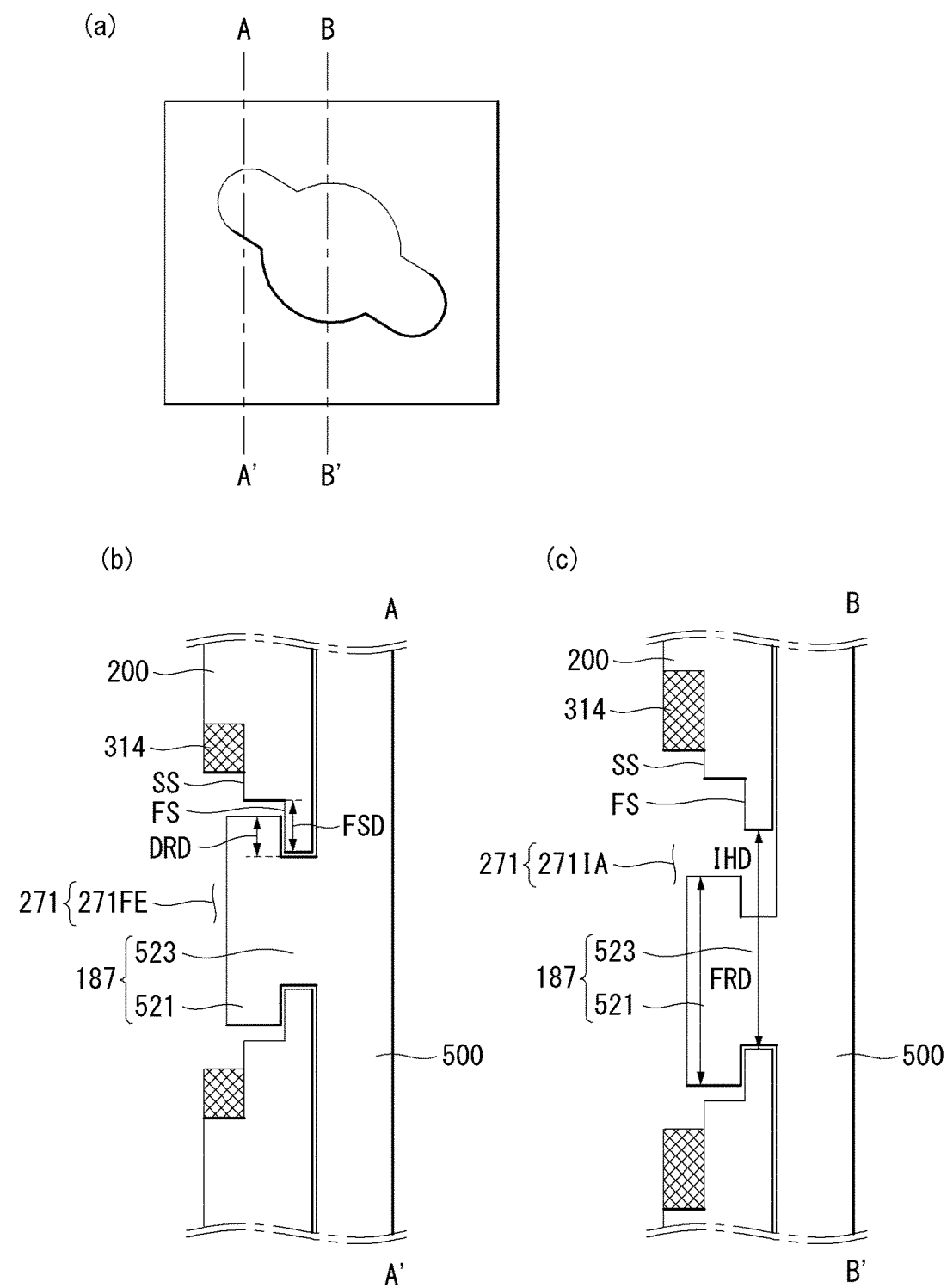

As shown in FIG. 21, when a hook 187 is inserted into the first extension part 271FE, the hook 187 can be fixed to the first extension part 271FE. In this case, difference DRD between the diameter of the first diameter part 521 and the diameter of the second diameter part 523 can be shorter than the width FSD of the first layer FS. In other words, the protruding part of the first diameter part 521 may not contact the boundary formed between the first layer FS and the second layer SS.

Since the first diameter part 521 does not contact the boundary formed between the first layer FS and the second layer SS, even if a first diameter part 521 having a different diameter is inserted, the hook 187 can still be inserted naturally into the first extension part 271FE. Although it is assumed in the current figure that a hook is inserted into the first extension part 271FE, the present invention is not limited to the aforementioned assumption, but can be equally applied to the case in which the hook is inserted into the second extension part 271SE.

In case the hook 187 is disposed at the insertion part 271IA, the hook 187 can move freely inside or outside the insertion part 271IA. Accordingly, the diameter FRD of the first diameter part 521 can be larger than the diameter IHD of the insertion part 271IA.

In the display device according to the present invention, the first diameter part 521 may not contact the boundary between the first layer FS and the second layer SS. Accordingly, size of the first diameter 521 of the hook 187 can be changed freely.

Figure 22:
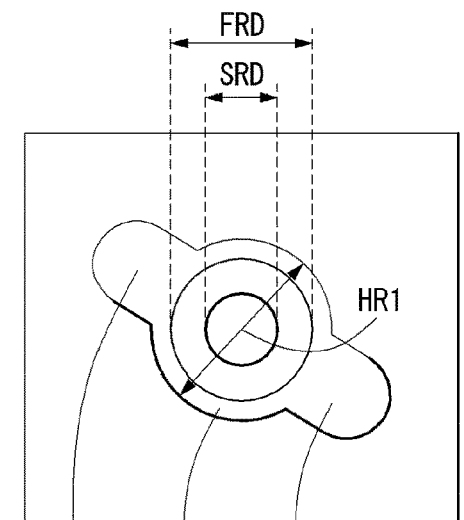
Figure 22:
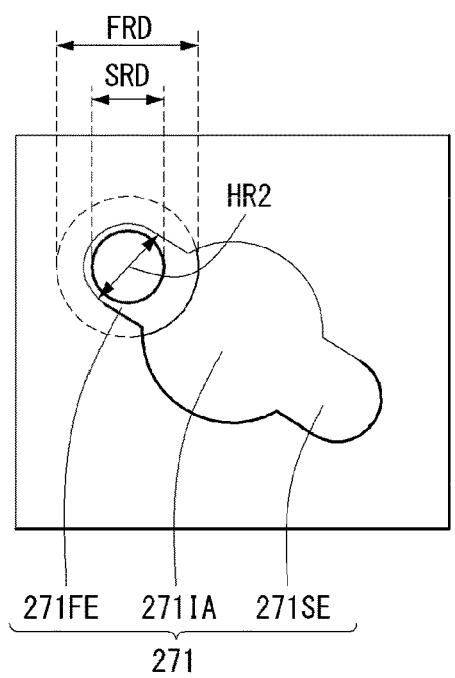

As shown in FIG. 22, when the hook 187 is combined with the fastening hole 271, the hook 187 can be inserted into the insertion part 271IA first. The width HR1 of the insertion part 271IA can be larger than the diameter FRD of the first diameter part 521. Accordingly, the hook 187 can be inserted into the insertion part 271IA of the fastening hole 271 freely.

Next, the hook 187 can move to the first extension part 271FE. Since the width HR2 of the first extension part 271FE is smaller than the diameter FED of the first diameter part 521, the hook 187 may not be easily separated from the fastening hole 271 while moving to the first extension part 271FE. Also, since the width HD2 of the first extension part 271FE is larger than the diameter SRD of the second diameter part 523, the hook 187 can move freely within the first extension part 271FE. In other words, the second part 271SA can guide the hook 187 to the position to which the hook can be combined.

Although it is assumed in the current figure that the hook 187 moves to the first extension part 271FE through the insertion part 271IA, the present invention is not limited to the assumption above, but the hook 187 may move to the second extension part 271SE through the insertion part 271IA.

In the display device according to the present invention, the insertion part 271IA of the fastening hole 271 does not match the width of the first and the second extension part 271FE, 271SE. Accordingly, the hook 187 may be not be easily separated from the fastening hole 271.

Figure 23:
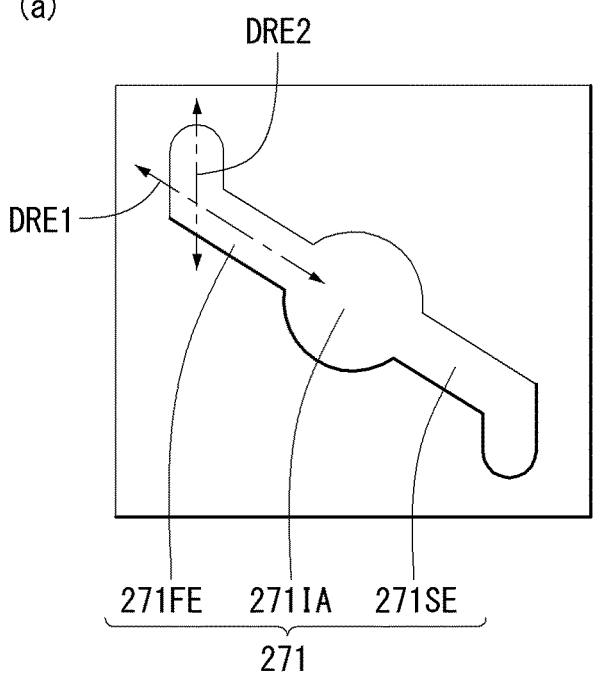
Figure 23:
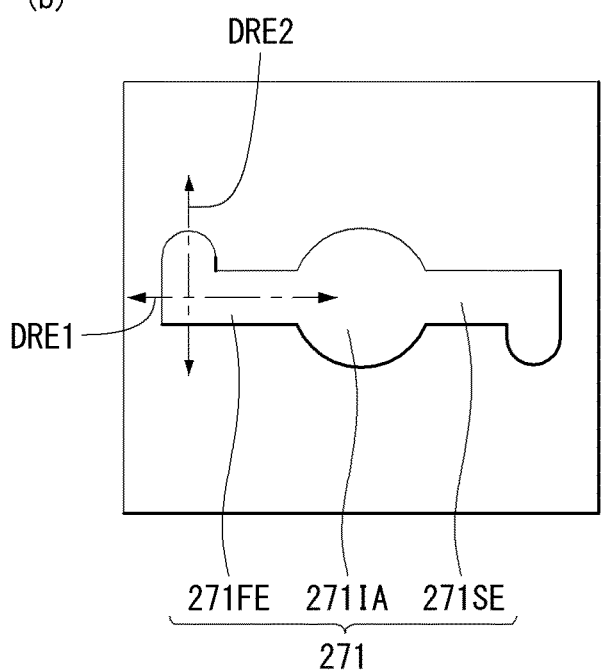

As shown in FIG. 23, at least one part of the first extension part 271FE can be extended in a direction different from the direction in which the other parts are extended. For example, the part of the first extension part 271FE which contact the insertion part 271IA can be extended in a first extension direction DRE1 while the inner part of the first extension part 271FE can be extended to a second extension part DRE2 different from the first extension direction DRE1. The parts of the first extension part 271FE extended in different directions can have the same or similar widths. The second extension part 271FE can have a symmetric shape with respect to the center of the insertion part 271IA. In other words, it indicates that at least one part of the second extension part 271FE can also be extended in a direction different from the direction in which the other parts are extended. In this case, in order to separate the hook from the fastening hole 271, the movement direction of the hook has to be changed. Accordingly, the head part can be combined with a target surface more firmly.

As shown in FIG. 23(*a*), the first extension direction (DRE1) can be included at an angle smaller than 90 degrees away from the up-down direction. In this case, even if an impact is applied from below, the hook can move again to the end part of the first extension part 271FE due to gravity. Accordingly, the hook cannot be easily separated from the fastening hole 271.

As shown in FIG. 23(*b*), the first extension direction DRE1 can be included at an angle of 90 degrees away from the up-down direction. In this case, it can be harder for the hook to move to other parts than would move when the first extension direction DRE1 is included at an angle different from 90 degrees. In other words, it indicates that the hook can be combined with the fastening hole 271 more firmly.

FIGS. 24 to 33 illustrate a wall bracket according to one embodiment of the present invention.

Figure 24:
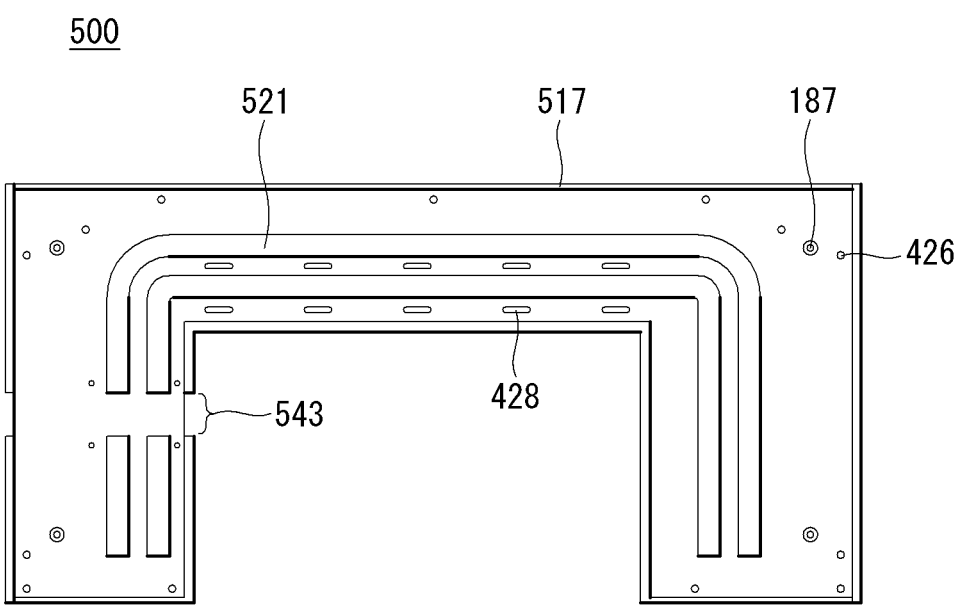
FIGS. 24 to 33 illustrate a wall bracket according to one embodiment of the present invention.

As shown in FIG. 24, a wall bracket 500 can include a forming part 521, a hemming part 517, a hook 187, and a first and a second hole 426, 428.

The forming part 521 can be the part extended inside the wall bracket according to the shape thereof. In other words, it indicates that the forming part 521 can be extended in the longitudinal direction in the central part of the wall bracket 500 and then extended toward the short sides at both sides of the wall bracket 500. The forming part 521 can protrude toward the front surface. The forming part 521 can improve strength of the wall bracket 500. Also, since the forming part 521 enlarges the contact area between the head part and the wall bracket 500, a combining force for the head part and the wall bracket 500 can be improved.

The hemming part 517 can be disposed at the edge area of the wall bracket 500. The hemming part 517 can be shaped as being bent toward the outside of the wall bracket 500. The hemming part 517 can improved strength of the wall bracket 500.

The forming part 500 and the hemming part 517 may not be disposed in a cable area 543 through which a flat cable is disposed. In other words, it indicates that the forming part 521 and the hemming part 517 can be separated from each other with respect to the cable area 543. The cable area 543 can be disposed being extended in the longitudinal direction in the central part of one part of the wall bracket 500. Accordingly, a space in which the flat cable is disposed can be secured when the head part and the wall bracket 500 are combined together.

The first hole 426 can be used to combined the wall bracket 500 to a target surface. For example, the wall bracket 500 can be combined to a target surface through the first hole 426 by using a screw. The first hole 426 can be disposed in the vicinity of the hemming part 517 of the wall bracket being separated by a predetermined distance.

The first hole 426 can be positioned near the area through which a flat cable passes. Accordingly, the first hole 426 can help the wall bracket 500 not be separated from a target surface within the area through which the flat cable passes.

The second hole 428 can be disposed between the forming parts in the central area of the wall bracket 500. The second hold 428 can function as an auxiliary hole. In other words, if the wall bracket 500 is not attached completely to the target surface when the first hole 426 is used, the second hole 428 can be utilized to fasten the wall bracket 500 tightly to the target surface.

The second hold 428 can be shaped as being extended in the longitudinal direction. Accordingly, the user can determine freely the position within the second hole 428 through which to insert a screw.

Figure 25:
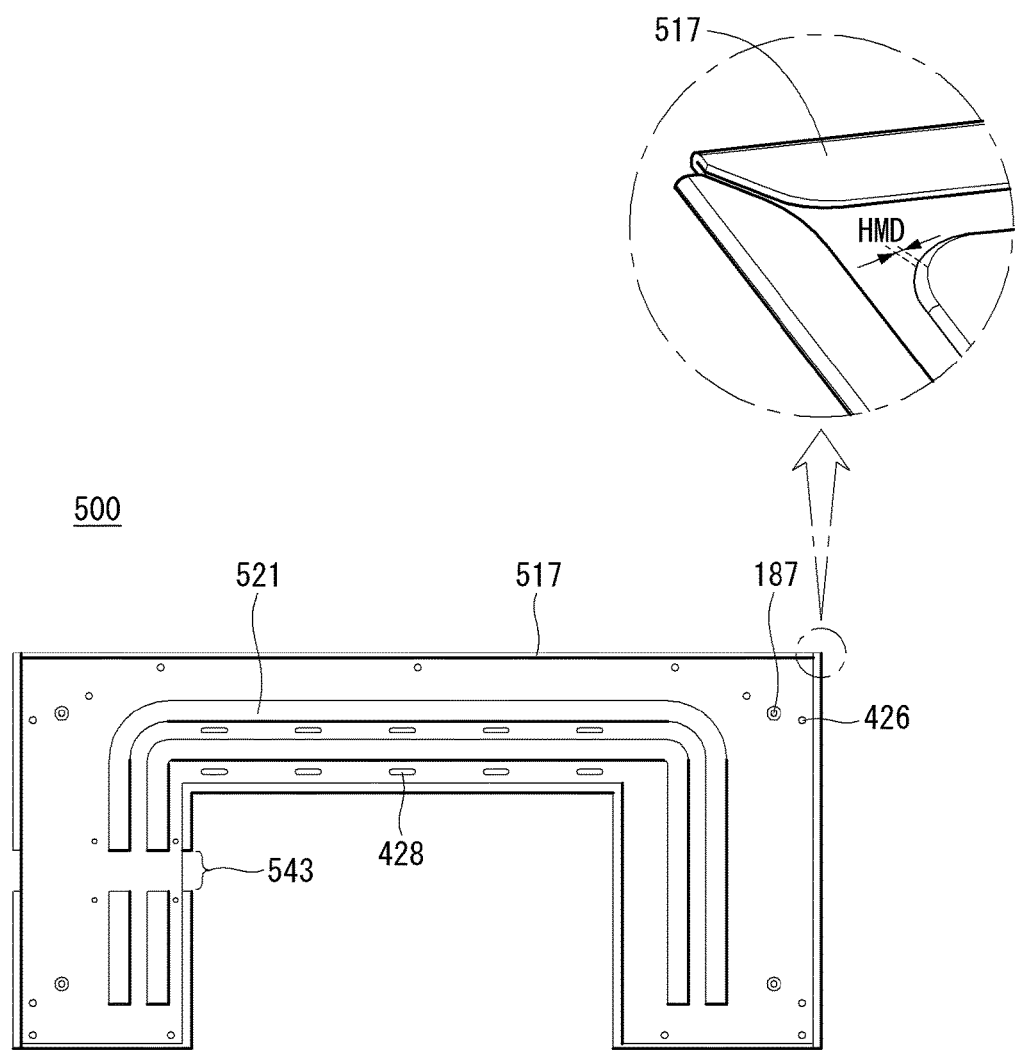

As shown in FIG. 25, the hemming part 517 can be shaped as being extended further than other parts of the wall bracket 500 by a predetermined distance (HMD). Also, one part of the hemming part 517 can be bent toward the inside of the wall bracket 500. In other words, it indicates that one part of the hemming part 517 can be folded toward the target surface.

Since the hemming part 517 protrudes further than the other parts of the wall bracket 500, strength of the wall bracket 500 can be improved. Also, since one part of the hemming part 517 is shaped as being bent, the edge appearance of the hemming part can give a neatly finished look, and can be helpful to improve strength of the wall bracket 500.

Figure 26:
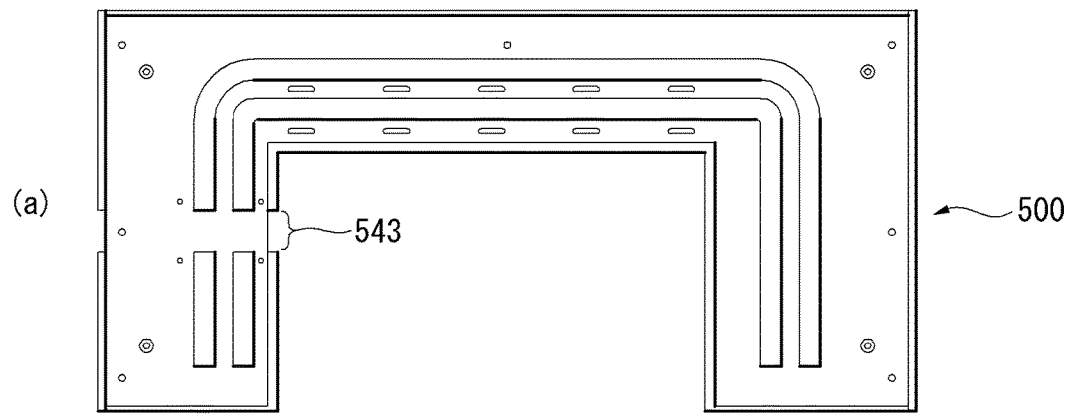
Figure 26:
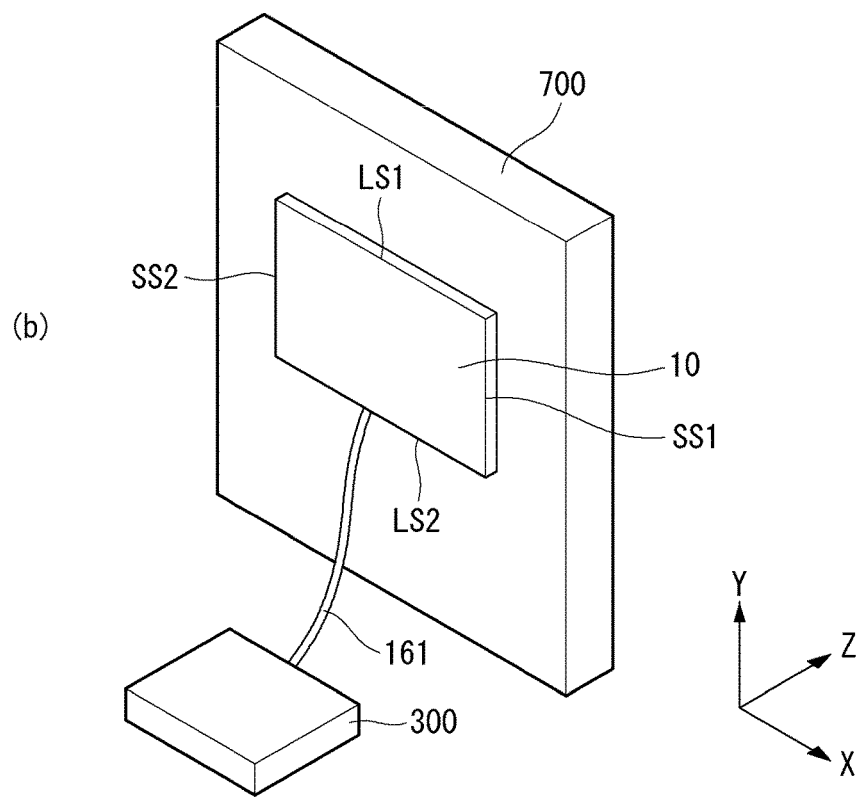

As shown in FIG. 26, in case a first long side (LS1) of the head part 10 constitutes a upper side, the interface PCB can be disposed in the lower part of the display panel. In this case, both protruding parts of the wall bracket 500 can be disposed to point downwards. Accordingly, a space in which the interface PCB and the flat cable are disposed can be secured between the head part 10 and a target surface.

The housing 300 can be disposed in the lower part of the head part 10. The housing 300 can be disposed on the bottom surface of the target surface 700. In this case, it becomes easy to operate and install the housing 300.

Figure 27:
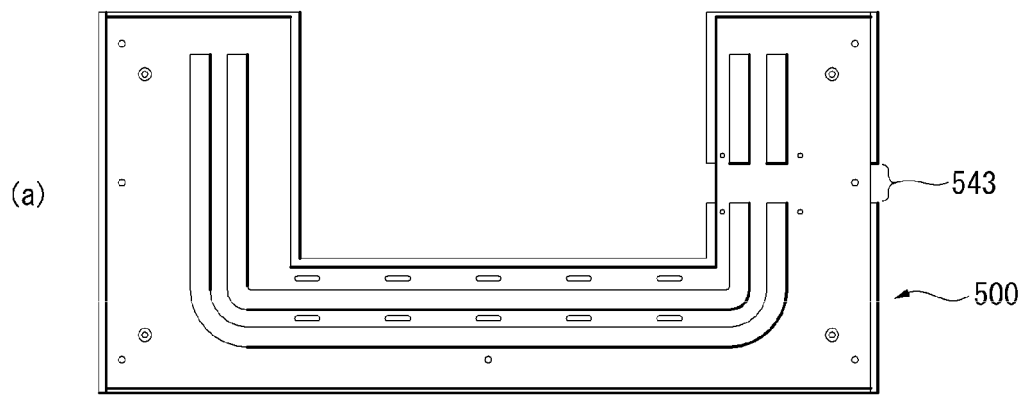
Figure 27:
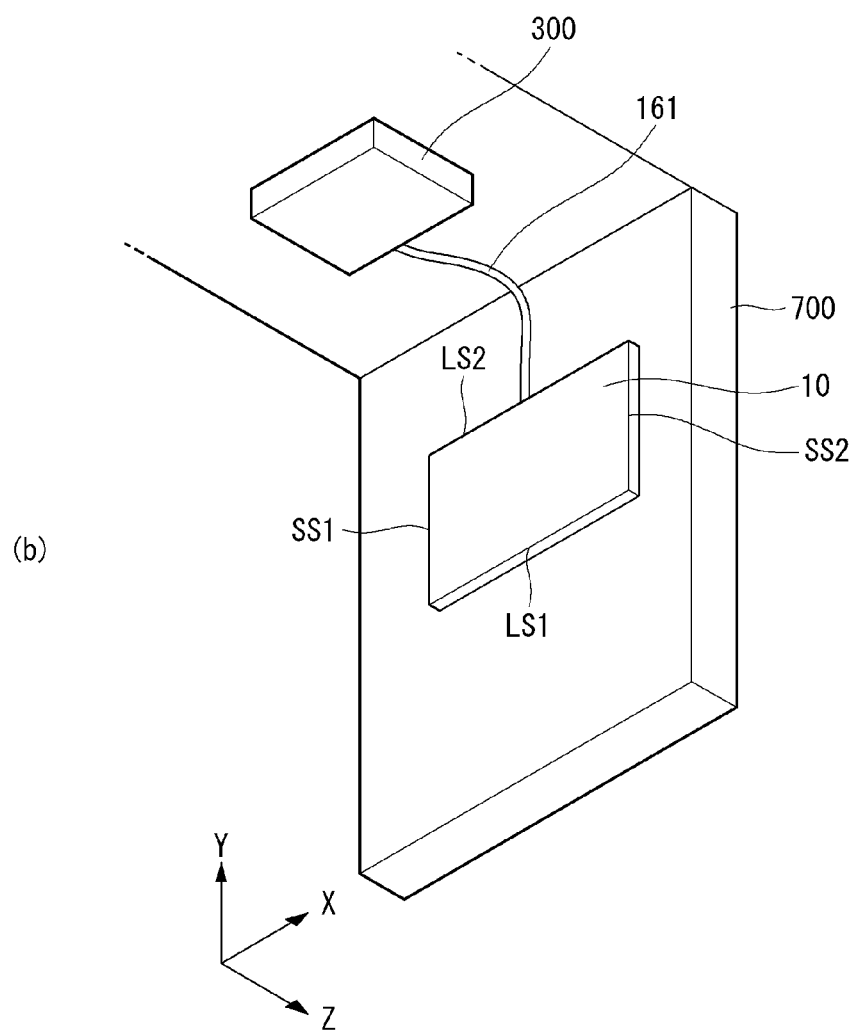

As shown in FIG. 27, in case a second long side (LS2) of the head part 10 constitute a upper side, the interface PCB can be disposed in the upper side of the display panel. In this case, both protruding parts of the wall bracket 500 can be disposed to point upwards.

The housing 300 can be disposed in the upper side of the head part 10. The housing 300 may be attached to the ceiling of the target surface 700. In this case, the housing 300 is hardly noticed, and thus the user can concentrate more on the display screen.

Figure 28:
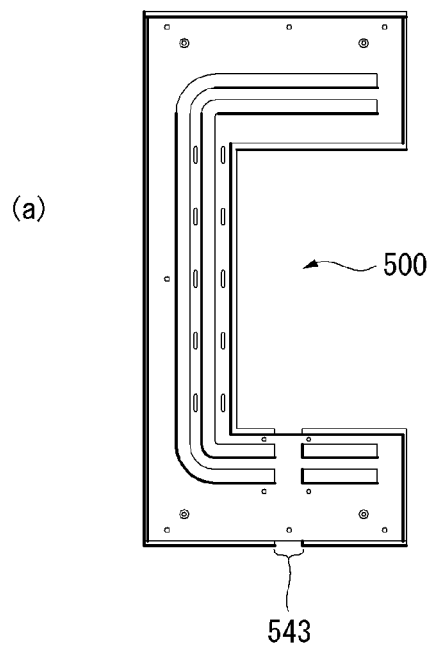
Figure 28:
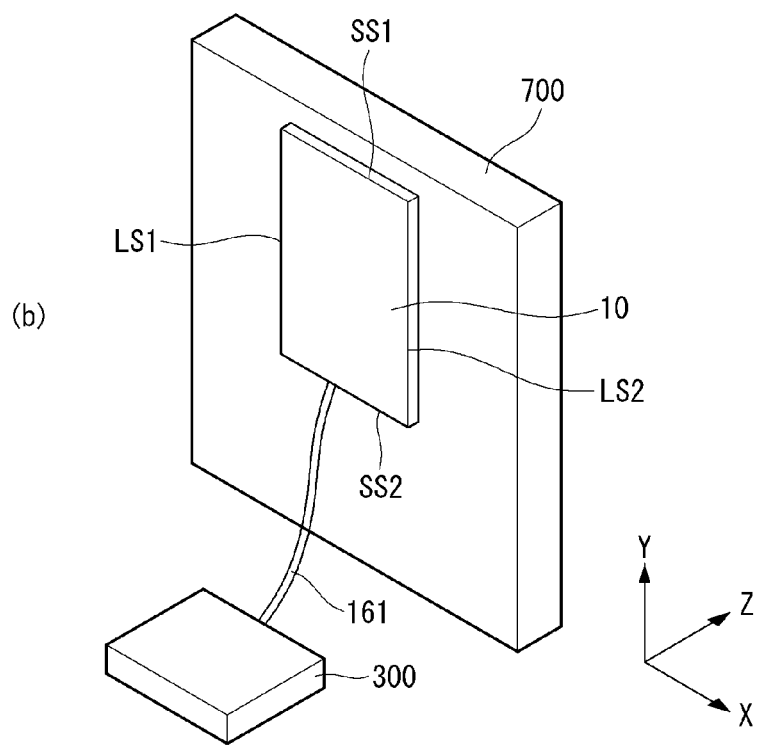

As shown in FIG. 28, in case a second short side (SS2) of the head part 10 constitute a upper side, the interface PCB can be disposed in the central area of the display panel. In this case, both protruding parts of the wall bracket 500 can be disposed to point to the right. A flat cable can pass through the cable area 543 of the wall bracket 500.

The housing 300 can be disposed in a lower side of the head part 10. The housing 300 can be disposed on the bottom surface of the target surface 700. In this case, it becomes easy to operate and install the housing 300.

The first and the second short side (SS1, SS2) of the head part 10 can be disposed to point in the horizontal direction. Accordingly, the user can enjoy a display screen extended to the upper side.

Figure 29:
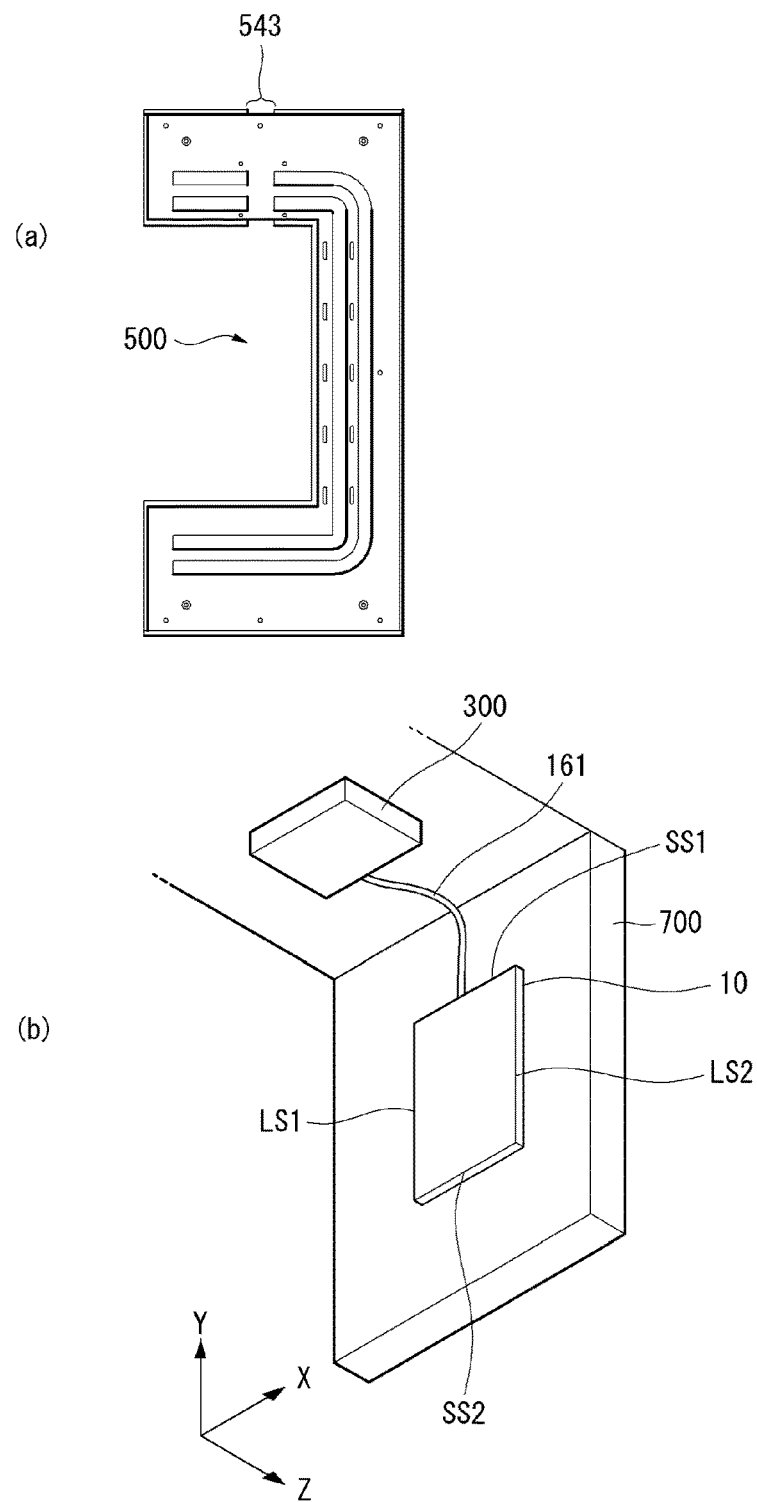
Figure 30:
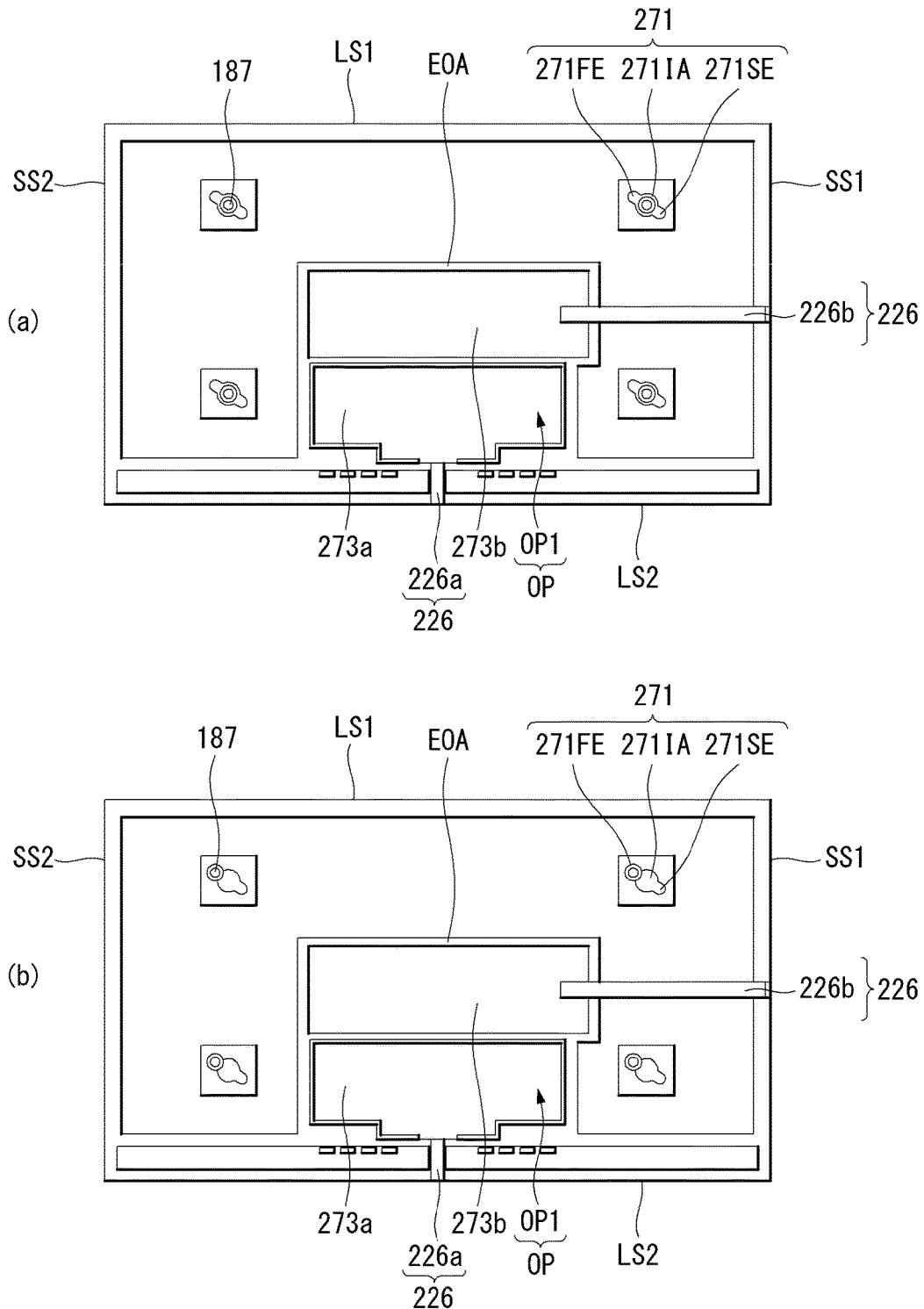
Figure 31:
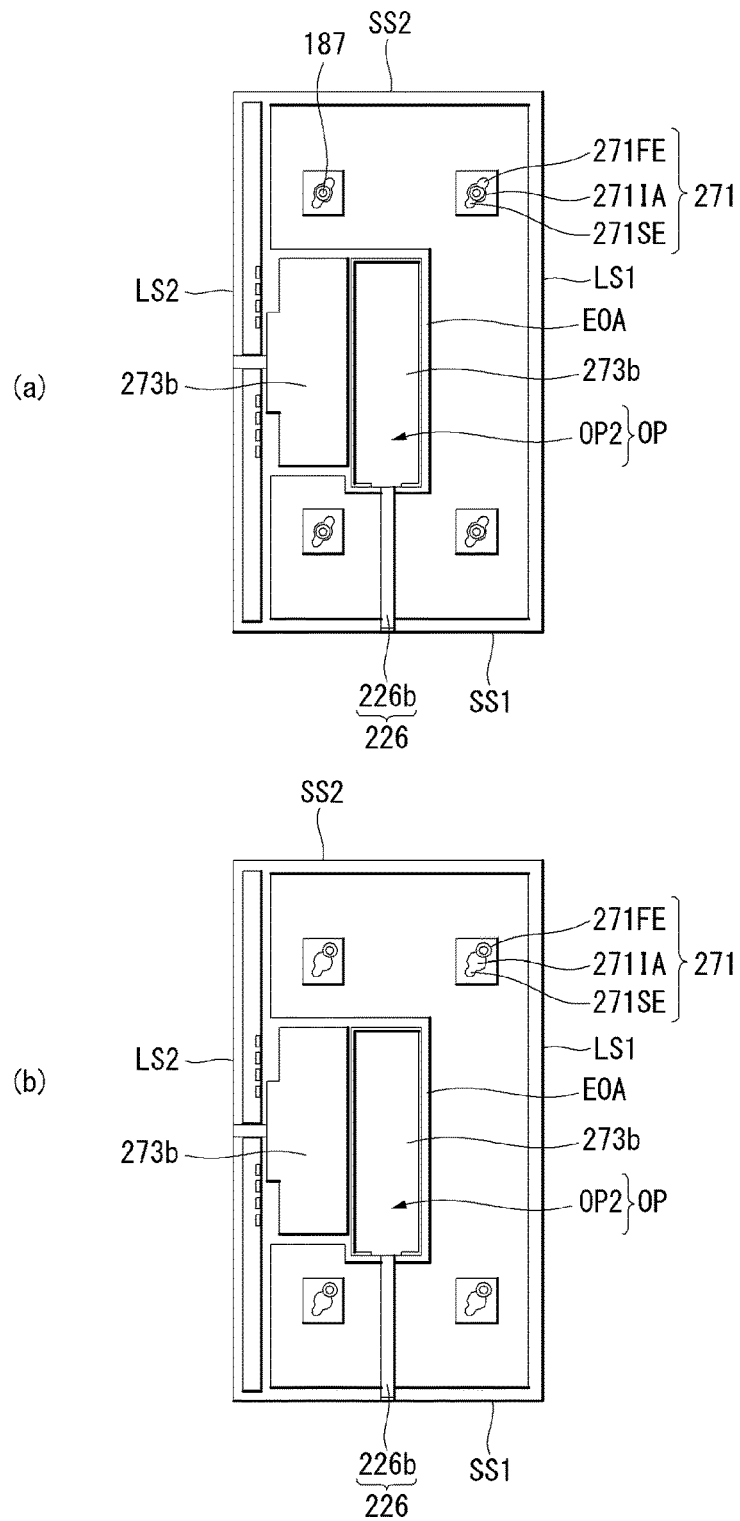
Figure 32:
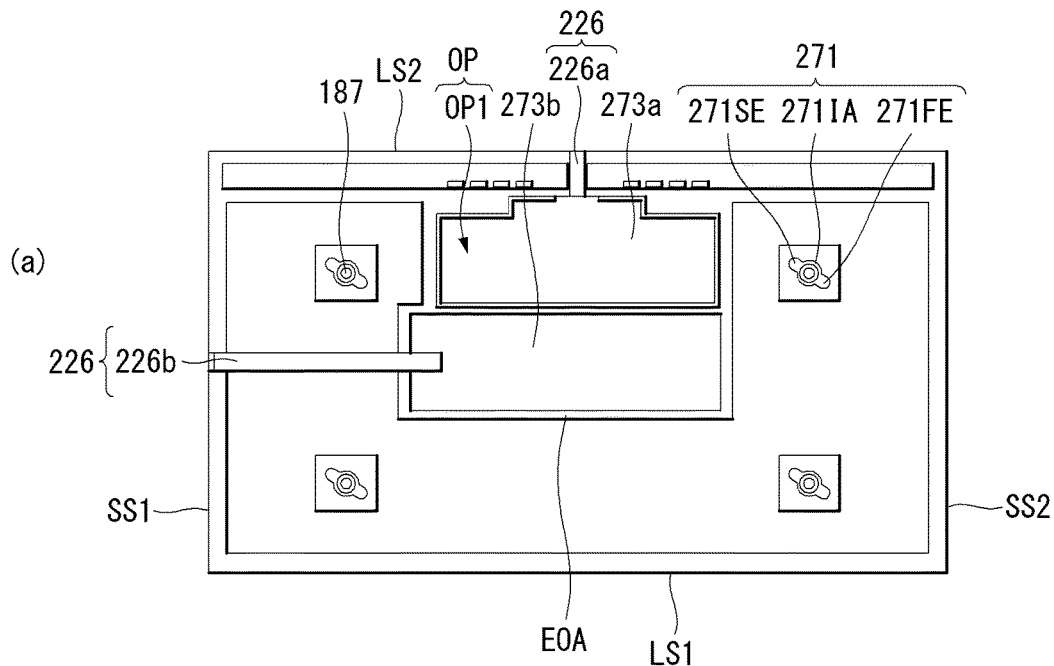
Figure 32:
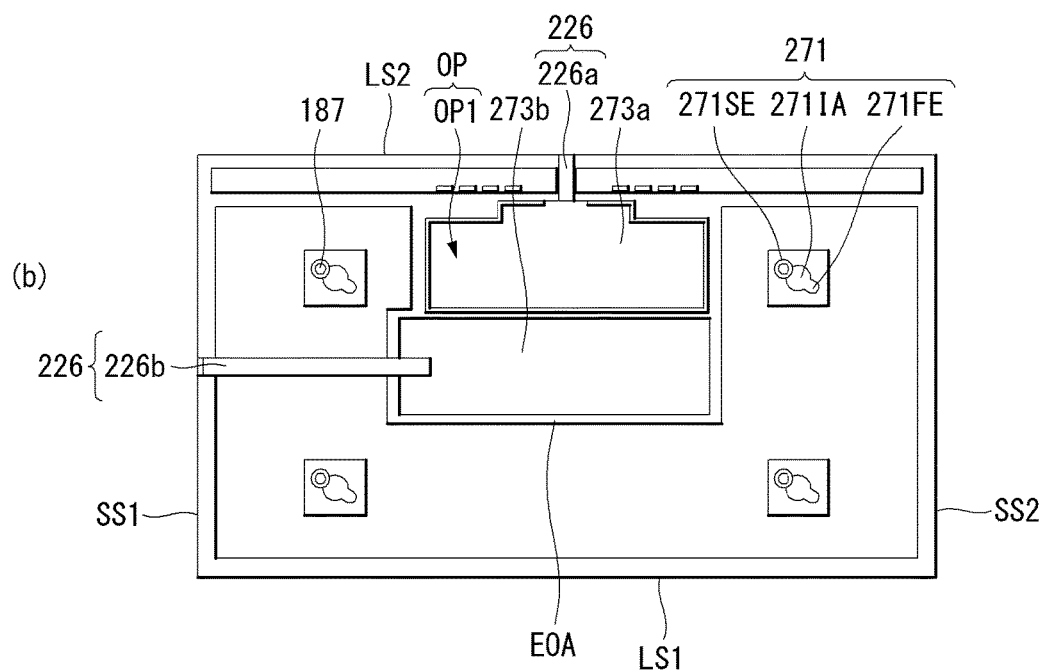
Figure 33:
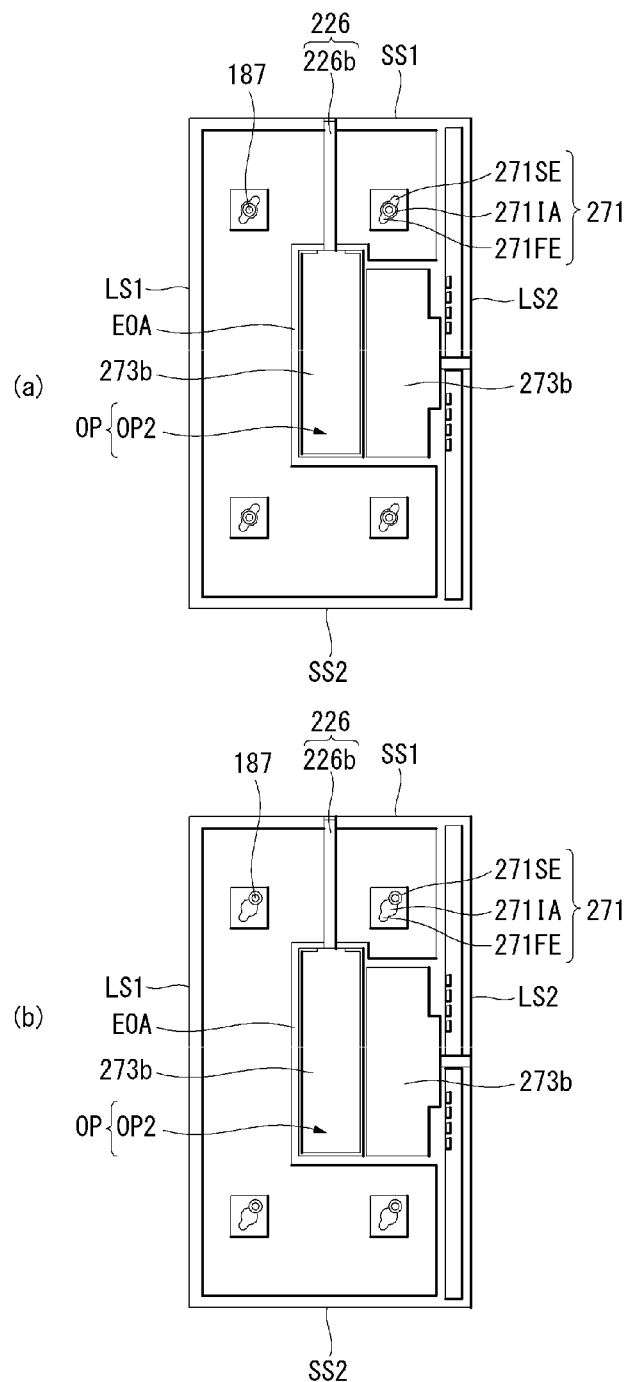

As shown in FIG. 29, a first short side (SS1) of the head part 10 constitutes a upper side, the interface PCB can be disposed in the central area of the display panel. In this case, both protruding parts of the wall bracket 500 can be disposed to point to the left. A flat cable can pass the cable area 543 of the wall bracket 500.

The housing 300 can be disposed in the upper side of the head part 10. The housing 300 may be attached to the ceiling of the target surface 700. In this case, the housing 300 is hardly noticed, and thus the user can concentrate more on the display screen.

The first and the second short side (SS1, SS2) of the head part 10 can be disposed to point in the horizontal direction. Accordingly, the user can enjoy a display screen extended to the upper side.

As shown in FIGS. 30(a), and (b), in case a second long side (LS2) is disposed in a lower part of the display panel, the first extension part 271FE can be disposed in the upper side of the insertion part 271IA. Accordingly, after a hook 187 is inserted through the insertion part 271IA, the hook 187 can move toward the first extension part 271FE. In other words, when a first cable forming part 226a points downwards, the hook 187 can move to the first extension part 271FE through the insertion part 271IA.

Also, as shown in FIGS. 31(a) and (b), in case a first short side (SS1) is disposed in a lower part of the display panel, the first extension part 271FE can be disposed in a upper side of the insertion part 271IA. Accordingly, after a hook 187 is inserted through the insertion part 271IA, the hook 187 can move toward the first extension part 271FE. In other words, when a second cable forming part 226b points downwards, the hook 187 can move to the first extension part 271FE through the insertion part 271IA.

As described in detail above, when a cable forming part 226 connected to the area in which an opening (OP) is formed points downwards, the hook 187 can move to the first extension part 271FE.

Differently from the description above, as shown in FIGS. 32(a) and (b), in case a first long side (LS1) is disposed in a lower part of the display panel, the second extension part 271SE can be disposed in a upper side of the insertion part 271IA. Accordingly, after a hook 187 is inserted through the insertion part 271IA, the hook 187 can move toward the second extension part 271SE.

In other words, when a first cable forming part 226a points upwards, the hook 187 can move to the second extension part 271SE through the insertion part 271IA.

Also, as shown in FIGS. 33(a) and (b), in case a second short side (SS2) is disposed in a lower part of the display panel, the second extension part 271SE can be disposed in a upper side of the insertion part 271IA. Accordingly, after a hook 187 is inserted through the insertion part 271IA, the hook 187 can move toward the second extension part 271SE. In other words, when a second cable forming part 226b points upwards, the hook 187 can move to the second extension part 271SE through the insertion part 271IA.

As described in detail above, when a cable forming part 226 connected to the area in which an opening (OP) is formed points upwards, the hook 187 can move to the second extension part 271SE.

In the display device according to the present invention, if a cable forming part 226 connected to the area in which an opening (OP) is formed points downwards, the hook 187 can move toward the first extension part 271FE while, if the cable forming part 226 connected to the area in which an opening (OP) is formed points upwards, the hook 187 can move to the second extension part 271SE.

In the display device according to the present invention, a fastening hole 271 can be dispose not only in the first extension part 271FE but also in the second extension part 271SE which is extended in the opposite direction of the first extension part 271FE. Accordingly, a display device can be combined to a target surface easily no matter which direction the display device is oriented.

FIGS. 34 to 37 illustrate a structure of a display device according to one embodiment of the present invention.

Figure 34:
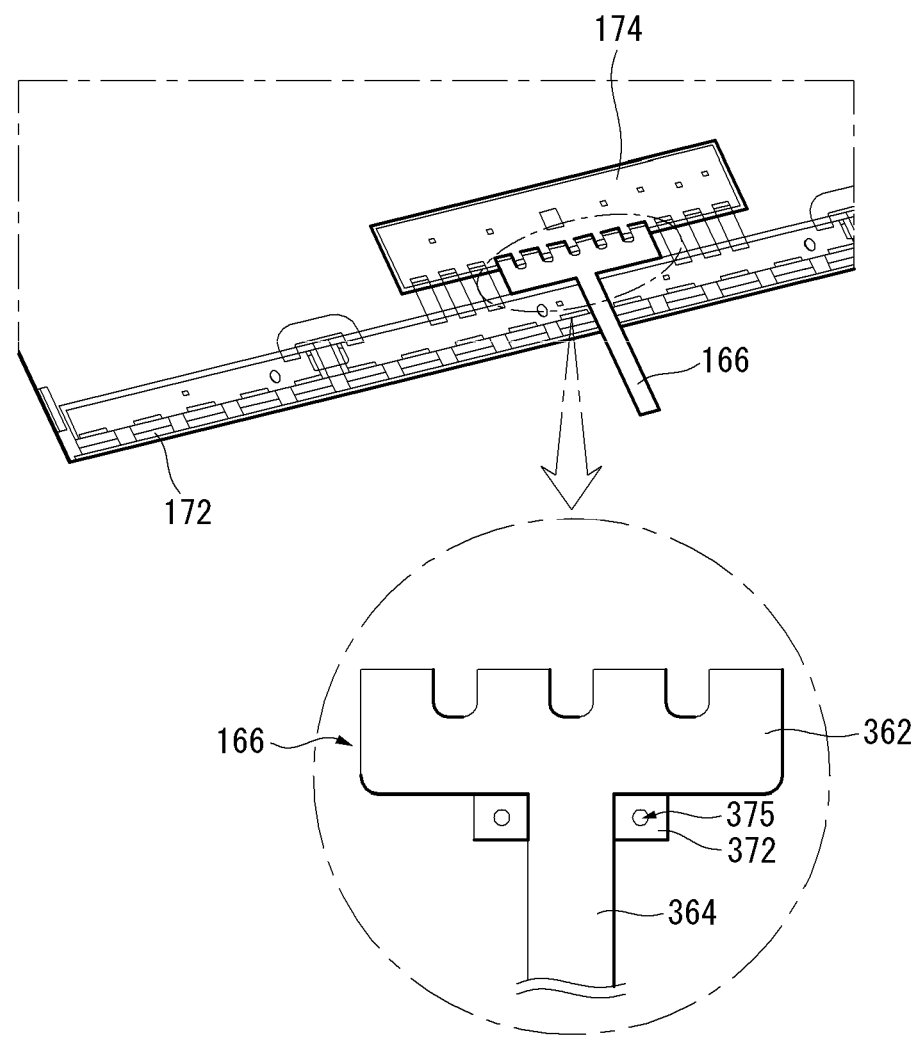
FIGS. 34 to 37 illustrate a structure of a display device according to one embodiment of the present invention.

As shown in FIG. 34, a flat cable 166 can include a connecting part 362, a fixing part 372, and a cable part 364. The connecting part 362 can be used to connect the flat cable 166 to the interface PCB 174. A cable can be divided into a plurality of cables and can be connected to separate connectors at the connecting part 362.

The cable part 364 can be the part to which a plurality of cables divided in the connecting part 362 are put together as a single cable. The cable part 364 can be connected to the connecting part 362. Since the cable part 364 comprises a single line, it gives a neatly finished look and at the same time, can be arranged in a convenient manner.

The fixing part 372 can be disposed at both sides of the part to which the cable part 364 and the connecting part 362 are connected. The fixing part 372 disposed at both sides can include a fixing hole 375. A flat cable 166 can be fixed to the head part 10 through the fixing hole 375. The fixing part 372 can be the part which fixes a flat cable 166 to be disposed on the cable forming part 226 of the head part 10. If the flat cable 166 is not fixed, it may contact the source PC 172 to cause interference or malfunction.

Figure 35:
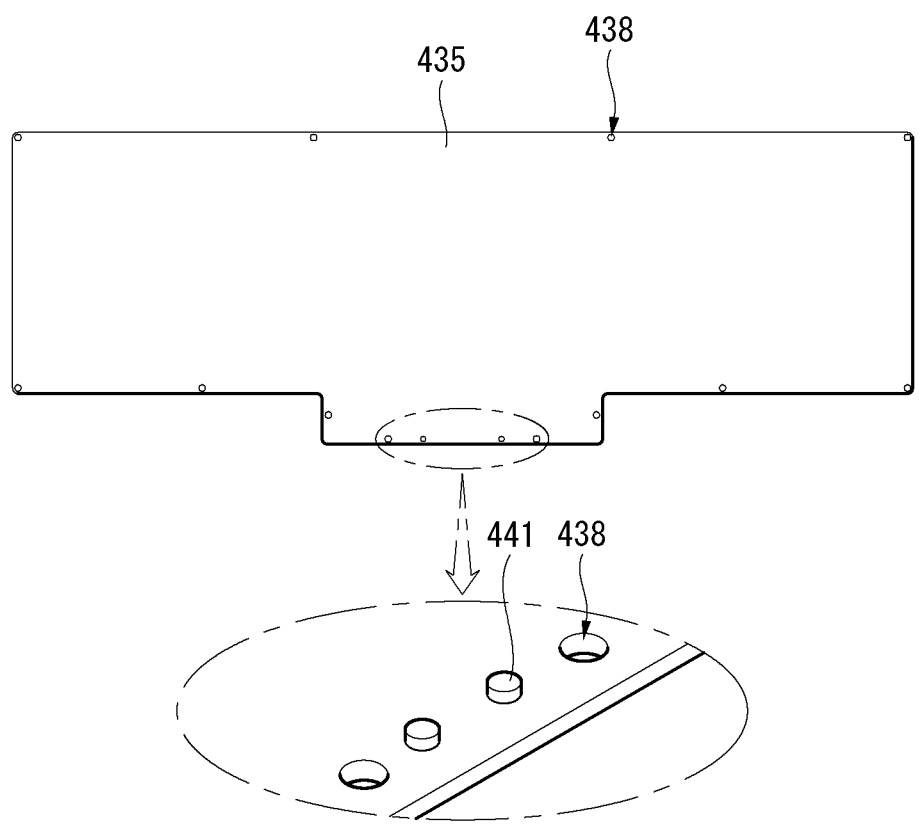

As shown in FIG. 35, a second PCB cover 435 can include a fixed protruding part 441 and a cover hole 438. The cover hole 438 can be the part which combines the second PCB cover 435 and the module cover 200. The cover hole 438 can combine the second PCB cover 435 and the module cover 200 by using a screw. The fixed protruding part 441 can protrude to one part of the second PCB cover 435. The fixed protruding part 441 can protrude toward the display panel while in the second state. Once the fixed protruding part 441 is combined to the fixed hole (375 of FIG. 29), position of the flat cable can be fixed.

The part of the second PCB cover in which the fixed protruding part 441 is disposed can protrude further than other parts. This is so because a flat cable is extended downwards from the interface PCB.

In the display device according to the present invention, a flat cable can be fixed as the fixed protruding part 441 is disposed in the second PCB cover 435. Accordingly, the flat cable can be arrange in a convenience manner and malfunction of the display device can be avoided.

Figure 36:
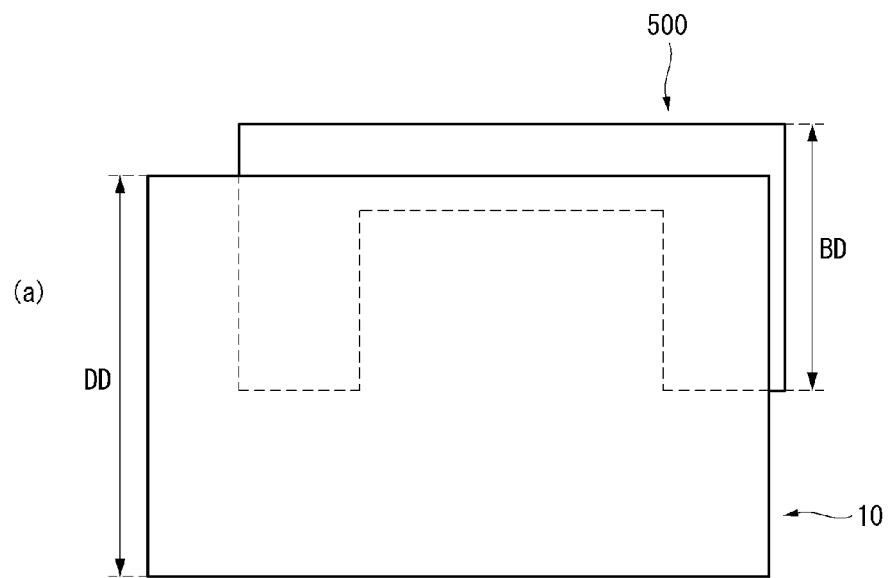
Figure 36:
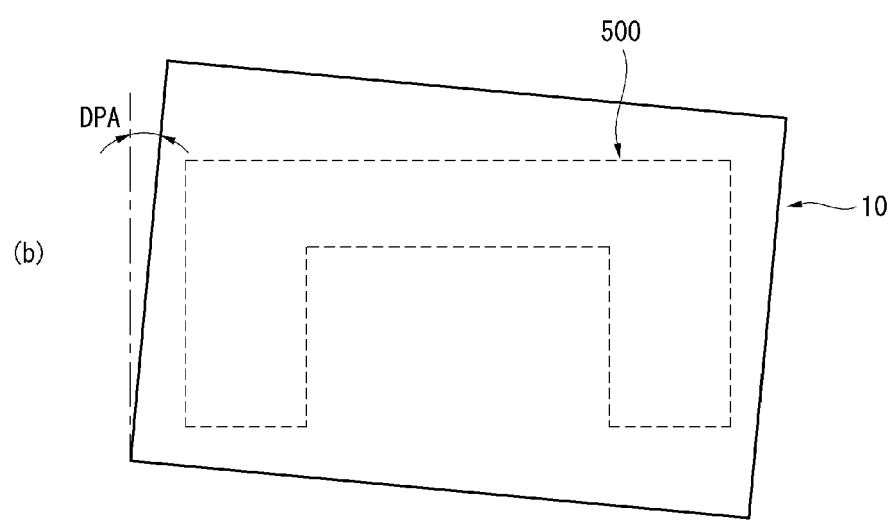

As shown in FIG. 36, the height DD of the head part 10 in the up-down direction can be higher than the height BD of the wall bracket 500. Accordingly, the head part 10 can completely shield the wall bracket 500 from the front surface. In this case, since the wall bracket 500 cannot be seen from the front surface, it can be difficult to arrange a hook and a fastening hole precisely.

For example, since the wall bracket 500 is not seen even if the head part 10 is included by a predetermined amount of angles (DPA) toward one side, at least part of the hook may not be inserted into the fastening hole. In this case, installation of the head part 10 becomes difficult, and moreover, it can be highly probable that the head part 10 is damaged by being separated from the wall bracket 500.

Figure 37:
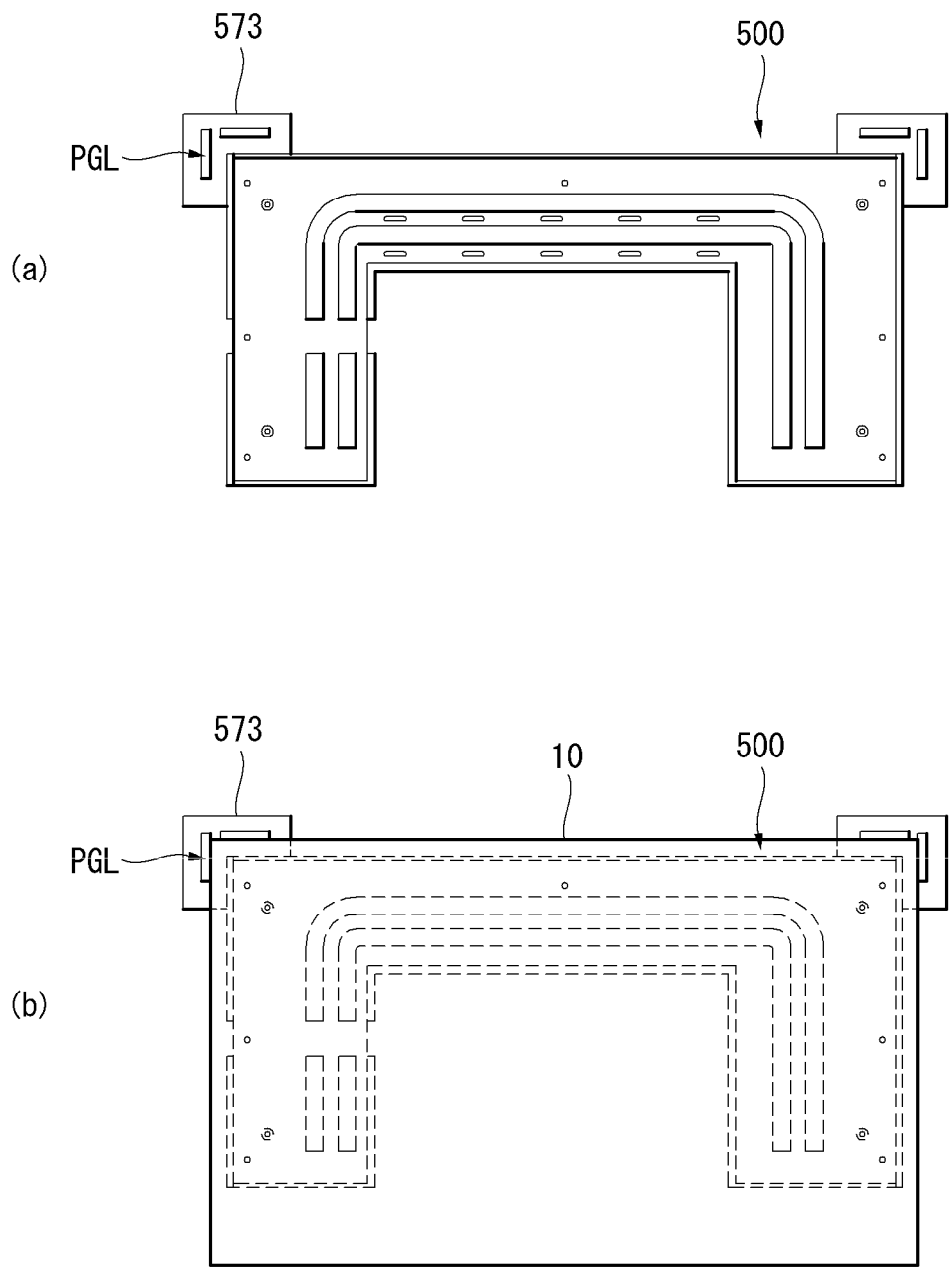

Accordingly, as shown in FIG. 37, a guide sheet 573 can be disposed at both upper corners of the wall bracket 500. The guide sheet 573 can be attached to a target surface. The guide sheet 573 can be shaped as being bent vertically. The guide sheet 573 can adjoin part of the upper side and part of the side edge of the wall bracket 500.

In the guide sheet 573, a panel guide line (PGL) can be formed being separated from the wall bracket 500. The panel guide line (PGL) can be a hole formed on the guide sheet 573. The panel guide line (PGL) can guide the vertex of the head part 10 of the display device to be positioned properly. In the panel guide line (PGL), a part extended horizontally and a part extended vertically can be disposed being separated from each other. However, the present invention is not limited to the aforementioned configuration, but the horizontally extended part and the vertically extended part of the panel guide line (PGL) may be connected to each other.

The user can arrange the upper side of the head part 10 to the horizontally extended part of the panel guide line (PGL) and both sides of the head part 10 to the vertically extended part of the panel guide line (PGL). In this case, the fastening hole of the head part 10 can be arranged to correspond to the hook of the wall bracket 500, thereby enabling them to be combined easily.

FIGS. 38 to 42 illustrate a display device according to another embodiment of the present invention.

Figure 38:
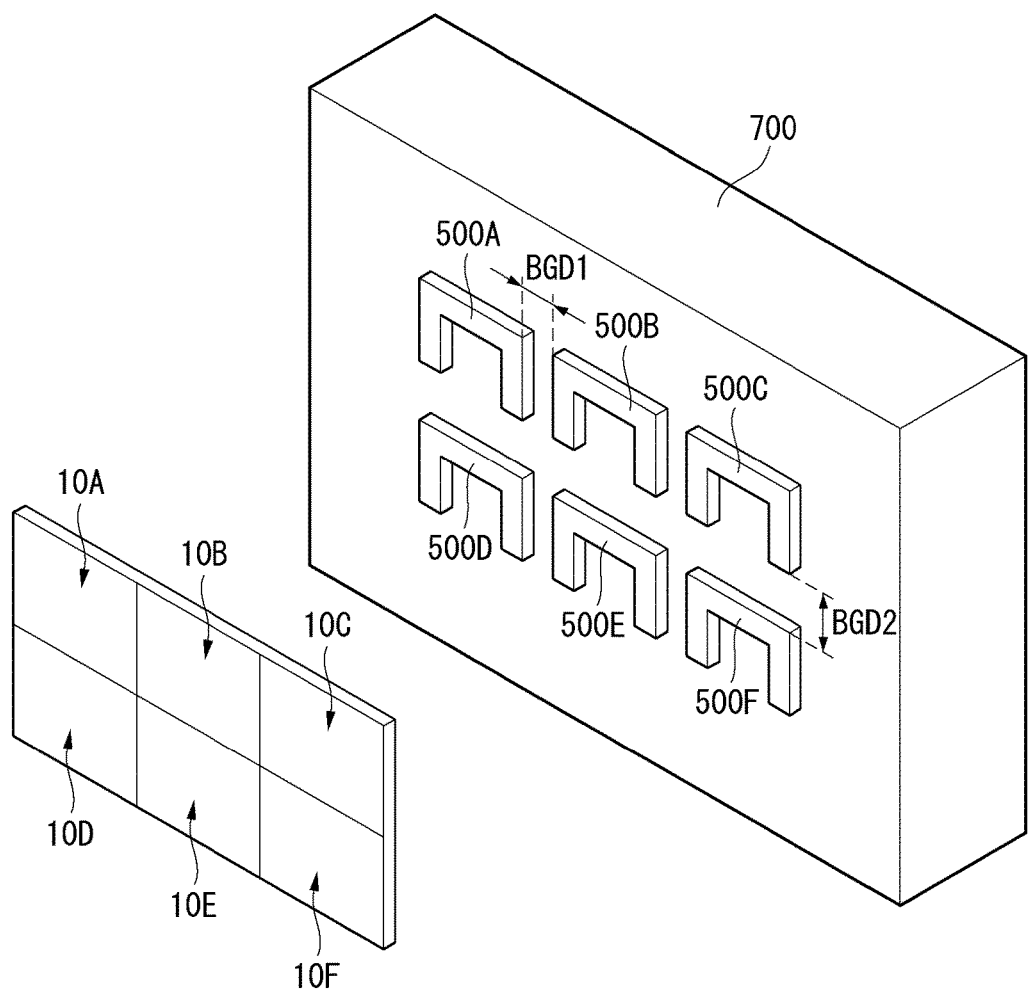
FIGS. 38 to 42 illustrate a display device according to another embodiment of the present invention.

As shown in FIG. 38, a plurality of head parts 10A-10F can be attached to a target surface 700. Any two neighboring head parts 10A-10F can contact to each other on the side surface. The plurality of head parts 10A-10F can be attached to the target surface 700 by using their own wall bracket 500A-500F. As described above, both of the vertical and horizontal widths of the wall bracket 500A-500F can be smaller than that of the head part 10. Accordingly, wall brackets 500A-500F are separated from each other by a predetermined distance BGD1 in the horizontal direction and also can be separated from each other by a predetermined distance BGD2.

In this document, it is assumed that the head parts 10A-10F are arranged in 2 rows and 3 columns. However, the present invention is not limited to the aforementioned configuration, and the number of head parts 10A-10F and arrangement thereof can be changed in various ways.

Figure 39:
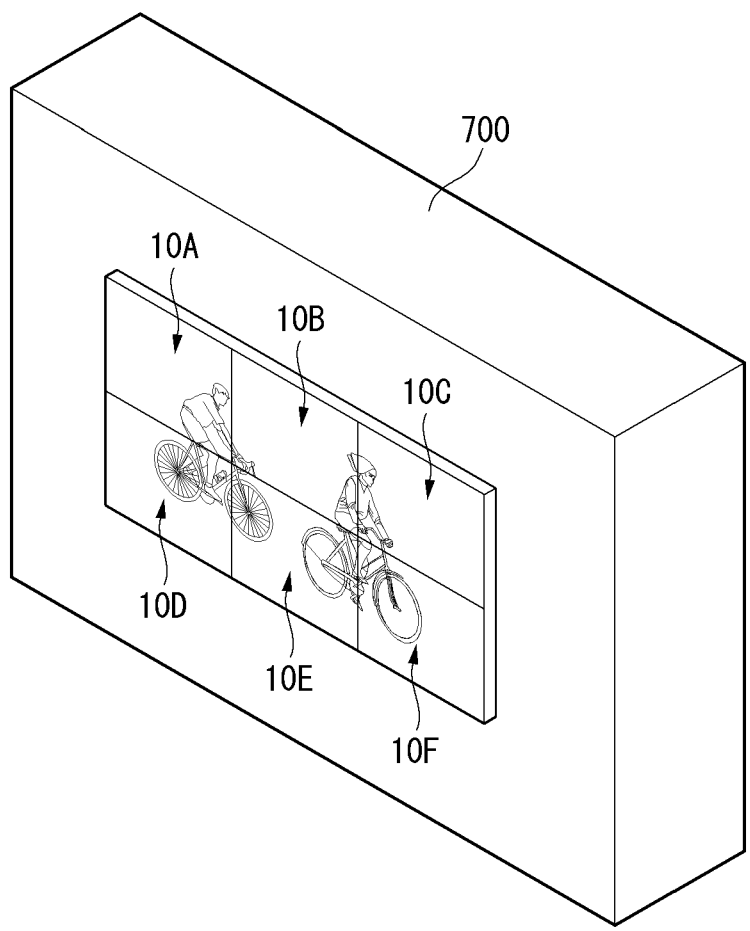

As shown in FIG. 39, in the display device according to the present invention, one image can be displayed over a plurality of head parts 10A-10F. In other words, one image is divided into sub-images which are subsequently displayed across a plurality of head parts 10A-10F.

According to an image division method set up by at least one PCB within the housing, an image signal can be split and form a plurality of segmented images. Afterwards, each segmented image can be transmitted to the corresponding head part 10A-10F to be displayed in the screen.

Since one image is displayed over a plurality of head parts 10A-10F in the display device according to the present invention, a very large image can be displayed on the screen.

Figure 40:
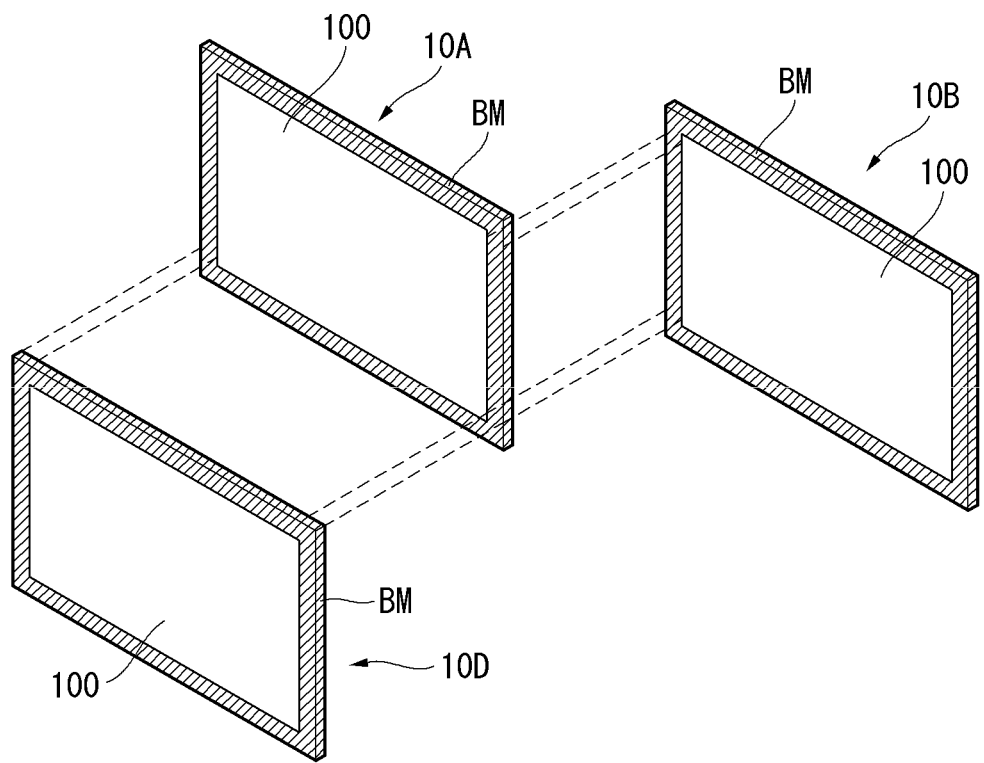
Figure 41:
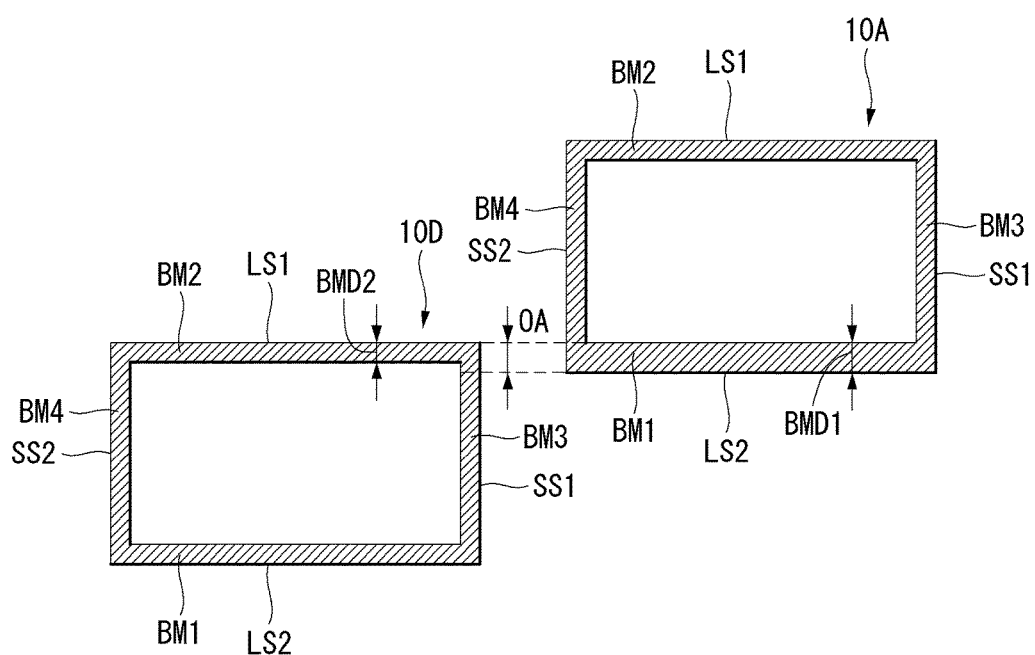

As shown in FIGS. 40 and 41, in the display device according to the present invention, the head part 10 can include a black matrix area.

The black matrix area can be the perimeter area of the display panel 100 in which an image is not displayed. The display panel 100 can include a display area and a non-display area. A display area can be the area in which an image is displayed while a non-display area can be the area in which an image is not displayed. A display area can be an active area while a non-display area can be an inactive area. The non-display area can be the area required for connecting to a display electrode and/or touch electrode. The non-display area can be formed along a long side and/or short side of the display panel 100.

As shown in FIG. 40, part of at least one head part 10 can be overlapped with part of at least one other neighboring head part 10. A non-display area of at least one head part 10 can be overlapped with a non-display area (BM) of at least one other neighboring head part 10. Accordingly, the non-display area (BM) may look smaller than would otherwise be the case in which at least one head part 10 and at least one other head part 10 are arranged side by side. In other words, when viewed from the outside, the width of the non-display area can appear to be smaller than its actual width.

As shown in FIG. 41, the non-display area of the side in which a source PCB for driving the display panel 100 is disposed can be wider than the non-display area of other sides. In other words, the width (BMD1) of a first non-display area (BM1) formed in the second long side (LS2) of the first head part 10A can be larger than the width (BMD2) of a second non-display area (BM2) formed in the first long side (LS1) of the fourth head part 10D.

When the first head part 10A and the fourth head part 10D are combined together, only the second non-display area (BM2) of the fourth head part 10D among the overlapping area (OA) can be observed from the outside. In other words, the first non-display area (BM1) of the first head part 10A can be occluded by the fourth head part 10D. The width (BMD2) of the second non-display area (BM2) can be smaller than the width of the overlapping area (OA) between the first 10A and the fourth head part 10D. Accordingly, when viewed from the outside, the width of the non-display area may appear to be smaller than the actual width.

In the display device according to the present invention, as the non-display areas of neighboring head parts are overlapped with each other, the width of the non-display area can appear to have reduced. Accordingly, the user can feel that the external appearance is neat.

Figure 42:
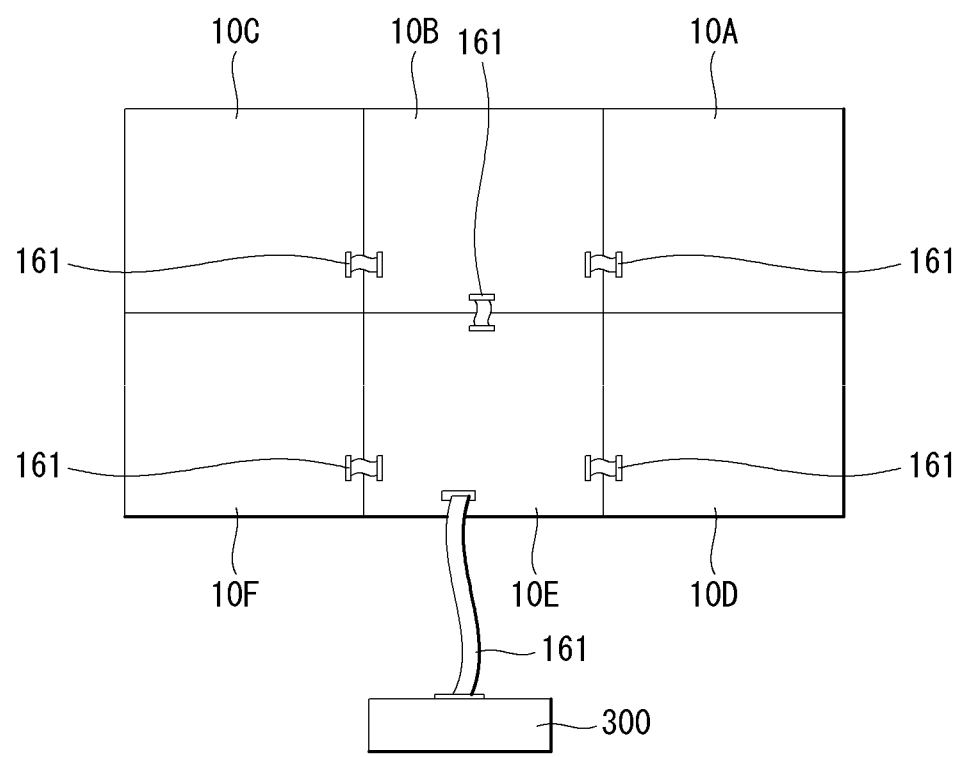

As shown in FIG. 42, in the display device according to the present invention, a plurality of head parts 10A-10F can receive a signal from a single housing 300.

One head part 10E can receive a signal directly from the housing 300 through a flat cable 161. Other head parts can receive a signal directly from the one head part 10E or receive a signal from another head part 10E which receives the signal from the one head part 10E.

When viewed from the rear, since the head parts 10A-10F are connected to each other through the flat cable 161, an image signal delivered from the housing 300 can be output to the screen.

Some embodiments or other embodiments of the present invention described above are not mutually exclusive to each other or distinguishable from each other. Individual structures or functions of some embodiments or other embodiments of the present invention described above can be used or combined together.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a display panel;
   a module cover disposed at a rear side of the display panel and shaped to comprise a fastening hole, wherein the module cover further comprises:
   a plurality of stepped levels at a location proximate to the fastening hole and at a front side of the module cover; and
   a cushion disposed at one of the plurality of levels,
   wherein the module cover further comprises a first area separated from a second area at a central portion of the module cover, wherein the module cover is further shaped to comprise an opening at the first area or the second area,
   wherein the display device is configured to allow selection of the opening at the first area or the second area, and
   wherein the opening is located at the first area when the display device is positioned in a landscape mode, and the opening is located at the second area when the display device is positioned in a portrait mode.

2. The display device of claim 1, wherein the module cover further comprises a cable accommodating part protruding at the front side of the module cover.

3. The display device of the claim 1, further comprising at least one cover configured to cover the opening at the first area or the second area.

4. The display device of claim 1, further comprising a protruding boundary area between the first area and the second area at a rear side of the module cover.

5. The display device of claim 1, wherein the fastening hole is disposed adjacent to a corner of the module cover.

6. The display device of claim 1, wherein the plurality of levels comprises a first level surrounding the fastening hole and a second level surrounding the first level, wherein a thickness of the module cover at the second level is thicker than a thickness of the module cover at the first level.

7. The display device of claim 6, wherein the cushion is disposed at the second level.

8. The display device of claim 6, wherein the cushion is disposed at the second level and positioned along an edge of the second level.

9. The display device of claim 6, wherein the cushion is disposed at a depressed portion of the second level configured to accommodate the cushion, wherein the depressed portion is positioned away from an edge of the second level.

10. The display device of claim 1, further comprising:
    a source printed circuit board (PCB) disposed at a rear side of the display panel;
    a source chip on film (COF) coupled to the source PCB and the display panel; and
    an adhesive sheet disposed between the display panel and the module cover and configured to accommodate the source COF.

11. The display device of claim 1, wherein the module cover is further shaped to define:
    an insertion opening portion of the fastening hole;
    a first extension opening portion of the fastening hole at a first side of the insertion opening portion; and
    a second extension opening portion of the fastening hole at a second side of the insertion opening portion opposite the first side.

12. The display device of claim 11, wherein:
    the insertion opening portion is circular;
    the first extension opening portion is an extended opening continued from the first side of the insertion opening portion; and
    the second extension opening portion is an extended opening continued from the second side of the insertion opening portion,
    wherein a longitudinal center axis of the first extension opening portion is aligned with a longitudinal center axis of the second extension opening portion, and
    wherein the module cover is further shaped to define:
    a third extension opening portion is an extended opening continued from an end of the first extension opening portion in a first direction; and
    a fourth extension opening portion is an extended opening continued from an end of the second extension opening portion in a second direction,
    wherein the first direction and the second direction are opposite directions, and
    a longitudinal center axis of the third extension opening portion is parallel to a longitudinal center axis of the fourth extension opening portion.

13. The display device of claim 1, wherein a longitudinal direction of the slit is inclined to a side of the display panel.

14. The display device of claim 1, wherein the slit is symmetrical with respect to the insertion hole.

15. The display device of claim 1, wherein the module cover further comprises:
    a plurality of stepped levels at a location proximate to the fastening hole and at a front side of the module cover; and
    a cushion disposed at one of the plurality of stepped levels.

16. The device of claim 1, wherein the second area is disposed above the first area at the rear side of the module cover.

17. The device of claim 1, wherein the location proximate to the fastening hole is configured to protrude at a rear side of the module cover at a height higher than any other protrusion at the rear side of the module cover.

18. A display device, comprising:
    a head part; and
    a wall bracket configured to attach the head part to a target surface, wherein the head part comprises:
a display panel;
a module cover disposed at a rear side of the display panel and comprising one or more fastening holes; and
one or more corresponding cushions covering a corresponding location proximate to each of the one or more fastening holes and disposed at a front side of the module cover, wherein:
the wall bracket comprises one or more protruding hooks corresponding to the one or more fastening holes;
the location proximate to each of the corresponding one or more fastening holes comprises a plurality of stepped levels; and
each of the one or more corresponding cushions is disposed at the corresponding plurality of stepped levels,
wherein the wall bracket further comprises a hemming portion along an edge of the wall bracket, wherein at least a part of the hemming portion is bent toward the target surface.

19. The display device of claim 18, wherein the wall bracket further comprises a cable accommodating part, wherein the hemming portion is not formed at a portion of the edge of the wall bracket corresponding to the cable accommodating part.

20. The display device of claim 19, further comprising:
a plurality of guide sheets configured to be removably coupled to corresponding upper corners of the wall bracket,
wherein each of the plurality of guide sheets comprises one or more panel guide protrusions corresponding to an upper corner of the module cover.

21. The display device of claim 18, wherein the module cover further comprises a plurality of stepped levels comprising a first level surrounding the fastening hole and a second level surrounding the first level such that a corresponding fastener does not contact an edge between the first level and the second level when the fastener is inserted into the fastening hole.

* * * * *